United States Patent
Seo et al.

(10) Patent No.: US 8,164,119 B2
(45) Date of Patent: Apr. 24, 2012

(54) SEMICONDUCTOR DEVICE INCLUDING CONDUCTIVE LINES WITH FINE LINE WIDTH AND METHOD OF FABRICATING THE SAME

(75) Inventors: Hyeoung-Won Seo, Yongin-si (KR); Byung-Hyug Roh, Yongin-si (KR); Seong-Goo Kim, Seoul (KR); Sang-Min Jeon, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/014,952

(22) Filed: Jan. 27, 2011

(65) Prior Publication Data
US 2011/0147800 A1 Jun. 23, 2011

Related U.S. Application Data
(62) Division of application No. 11/865,738, filed on Oct. 2, 2007, now Pat. No. 7,888,720.

(30) Foreign Application Priority Data
Oct. 2, 2006 (KR) .................. 10-2006-0097266

(51) Int. Cl.
*H01L 27/10* (2006.01)

(52) U.S. Cl. .................. 257/208; 257/786; 257/E23.142
(58) Field of Classification Search .................. 257/208, 257/E23.142
See application file for complete search history.

(56) References Cited

U.S. PATENT DOCUMENTS
| | | | |
|---|---|---|---|
| 7,009,208 | B2 | 3/2006 | Aratani et al. |
| 2002/0031006 | A1 | 3/2002 | Arimoto et al. |
| 2003/0062550 | A1 | 4/2003 | Sekiguchi et al. |

FOREIGN PATENT DOCUMENTS
| | | |
|---|---|---|
| JP | 2004-134702 | 4/2004 |
| JP | 2004-006579 | 8/2004 |
| JP | 2006245625 | 9/2006 |
| KR | 1020010014804 A | 2/2001 |
| KR | 1020040055705 A | 6/2004 |
| KR | 1020040085924 A | 10/2004 |

Primary Examiner — Thien F Tran
(74) Attorney, Agent, or Firm — Volentine & Whitt, PLLC

(57) ABSTRACT

A semiconductor device comprises a semiconductor substrate including a first core region and a second core region between which a cell array region is interposed, a first conductive line and a second conductive line extending to the first core region across the cell array region, and a third conductive line and a fourth conductive line extending to the second core region across the cell array region, wherein a line width of the first through fourth conductive lines is smaller than a resolution limit in a lithography process.

2 Claims, 35 Drawing Sheets

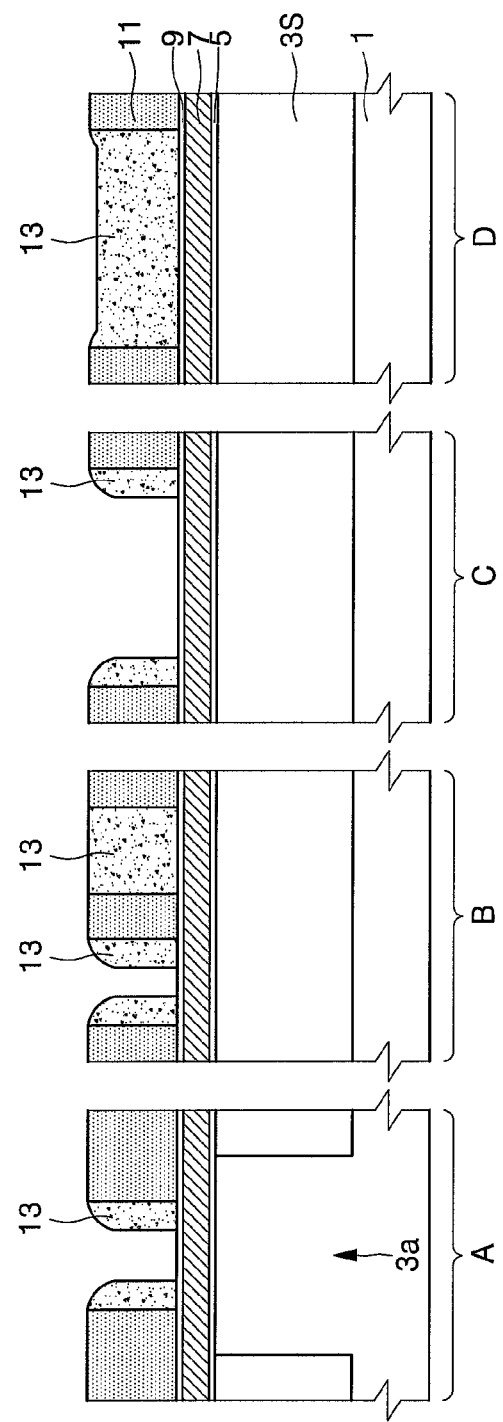

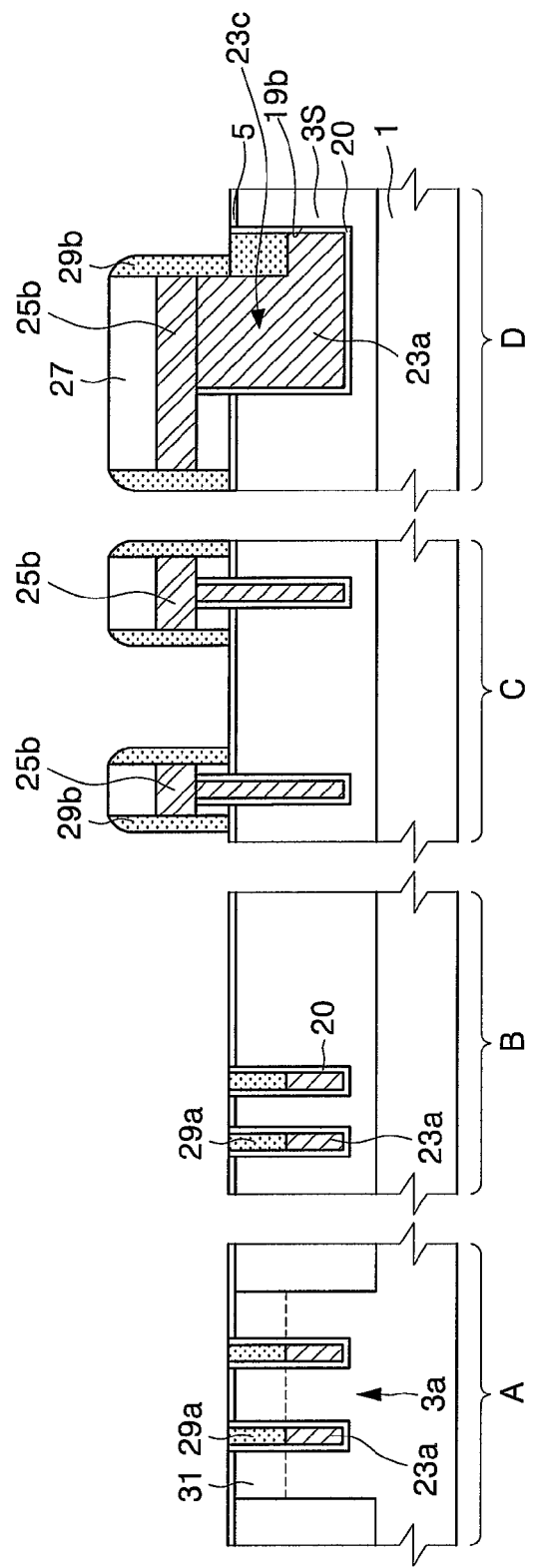

US 8,164,119 B2

SEMICONDUCTOR DEVICE INCLUDING CONDUCTIVE LINES WITH FINE LINE WIDTH AND METHOD OF FABRICATING THE SAME

CROSS REFERENCE TO RELATED APPLICATIONS

This is a divisional of application Ser. No. 11/865,738, filed Oct. 2, 2007, which a claim of priority is made to Korean Patent Application No. 10-2006-0097266, filed on Oct. 2, 2006, the contents of which are hereby incorporated herein by reference in their entirety.

BACKGROUND OF THE INVENTION

1. Field of the Invention

The present disclosure relates to a semiconductor device and a method of fabricating the same and, more particularly, to a semiconductor device including conductive lines with a fine line width and a method of fabricating the same.

2. Description of Related Art

In recent years, as the demand for smaller sized electronic appliances increases, an increasing number of methods for increasing the integration density of semiconductor devices are being developed. These methods include not only techniques for reducing the size of components of the semiconductor devices, but also techniques for efficiently disposing components of the semiconductor devices on surfaces such as, for example, a semiconductor substrate. For example, a semiconductor memory device, such as a dynamic random access memory (DRAM), includes a plurality of memory cell array regions and core regions disposed around the cell array regions. Each of the cell array regions includes a plurality of memory unit cells, each of which has a cell transistor, a cell capacitor, and an interconnection portion.

In order to increase integration efficiency, a technique for forming the cell transistor on a semiconductor device, stacking an interlayer insulating layer on the cell transistor, and forming the cell capacitor on the interlayer insulating layer has been widely used. Furthermore, source and drain regions of the cell transistor are connected to a lower electrode or bit line of the cell capacitor, and a gate electrode of the cell transistor is connected to a word line thereof. However, with a reduction in size of the cell transistor, it is increasingly difficult to dispose interconnection lines required for operating the cell transistor. That is, it is increasingly difficult to dispose bit lines and word lines required for operating a cell transistor as the size of the cell transistor is being continually reduced.

A method of disposing word lines and bit lines is disclosed in U.S. Pat. No. 7,009,208 B2 entitled "Memory Device and Method of Production and Method of Use Same and Semiconductor Device and Method of Production of Same" by Aratani et al ("Aratani"). According to Aratani, a plurality of word lines is disposed in a memory portion having a plurality of memory cells (i.e., a memory cell array region). In this case, the word lines extend in a first direction in order to form a contact portion in one side of the memory cell array region. In other words, the word lines extend only in one direction from the memory cell array region. Thus, a sufficient region for the contact portion may be secured owing to the word lines extending in one direction. However, Aratani suffers from a number of limitations. For example, because the word lines extend only in one direction from the memory cell array region, when the word lines have a line width smaller than the resolution limit in a lithography process, it may be difficult to secure a region for the contact region of the word lines.

Therefore, there may be a need to develop a new method of disposing interconnection lines, in order to secure a sufficient contact region and overcome shrinkage in line width of interconnection lines, such as word lines. The present disclosure is directed towards overcoming one or more limitations of the prior art method of disposing word lines and bit lines.

SUMMARY

One aspect of the present disclosure includes a semiconductor device. The device comprises a semiconductor substrate including a first core region and a second core region between which a cell array region is interposed, a first conductive line and a second conductive line extending to the first core region across the cell array region, and a third conductive line and a fourth conductive line extending to the second core region across the cell array region, wherein a line width of the first through fourth conductive lines is smaller than a resolution limit in a lithography process.

Another aspect of the present disclosure includes a semiconductor device. The device comprises a semiconductor substrate including a first core region and a second core region, between which a cell array region is interposed, first, second, third, and fourth conductive lines extending to the first and second core regions across the cell array region, the first through fourth conductive lines having a line width smaller than a resolution limit in a lithography process, first contact pads electrically connected to end portions of the second and fourth conductive lines in the first core region, and second contact pads electrically connected to end portions of the first and third conductive lines in the second core region, wherein the first contact pads are arranged diagonally adjacent to each other, and the second contact pads are arranged diagonally adjacent to each other.

Yet another aspect of the present disclosure includes a method of fabricating a semiconductor device. The method comprises providing a semiconductor substrate including a first core region and a second core region between which a cell array region is interposed and forming a first conductive line and a second conductive line extending to the first core region across the cell array region, and forming a third conductive line and a fourth conductive line extending to the second core region across the cell array region, wherein the first through fourth conductive lines are formed to have a line width smaller than a resolution limit in a lithography process.

Another aspect of the present disclosure includes a method of fabricating a semiconductor device. The method comprises providing a semiconductor substrate including a first core region and a second core region between which a cell array region is interposed, forming a hard mask including a first sacrificial opening and a second sacrificial opening that extend to the first and second core regions across the cell array region, each of the first and second sacrificial openings having a width of one feature size in the cell array region and a greater width in the first and second core regions than in the cell array region, forming a first sacrificial spacer and a second sacrificial spacer in the first and second sacrificial openings, etching end portions of the first and second sacrificial spacers located in the first and second core regions using a node separation process, and forming a first sacrificial spacer pattern and a second sacrificial spacer pattern in the first sacrificial opening and a third sacrificial spacer pattern and a fourth sacrificial spacer pattern in the second sacrificial opening, filling the first and second sacrificial openings whose sidewalls are covered by the first through fourth sacrificial spacer patterns by forming a mask pattern, etching the first through fourth sacrificial spacer patterns and the semiconductor substrate using the hard mask and the mask pattern as etch masks, and forming first through fourth trenches, forming a conductive layer on the semiconductor substrate including the first through fourth trenches, forming first contact pad masks and second contact pad masks on the conductive layer, the first contact pad masks overlapping end portions of the second and fourth trenches in the first core region and the second contact pad masks overlapping end portions of the first and third trenches in the second core region, and etching the conductive layer using the first and second contact pad masks as etch masks, forming first through fourth conductive lines partially filling the first through fourth trenches, and forming first contact pads electrically connected to end portions of the second and fourth conductive lines in the first core region and second contact pads electrically connected to end portions of the first and third conductive lines in the second core region, wherein the first contact pads are arranged diagonally adjacent to each other, and the second contact pads are arranged diagonally adjacent to each other.

BRIEF DESCRIPTION OF THE DRAWINGS

The foregoing and other objects and features of the disclosure will be apparent from the following more particular description of exemplary embodiments of the disclosure, as illustrated in the accompanying drawings. The drawings are not necessarily to scale, emphasis instead being placed upon illustrating the principles of the disclosure.

FIGS. 12A through 12G are cross-sectional views illustrating a method of fabricating a semiconductor device according to an exemplary disclosed embodiment.

DETAILED DESCRIPTION

Figure 1:
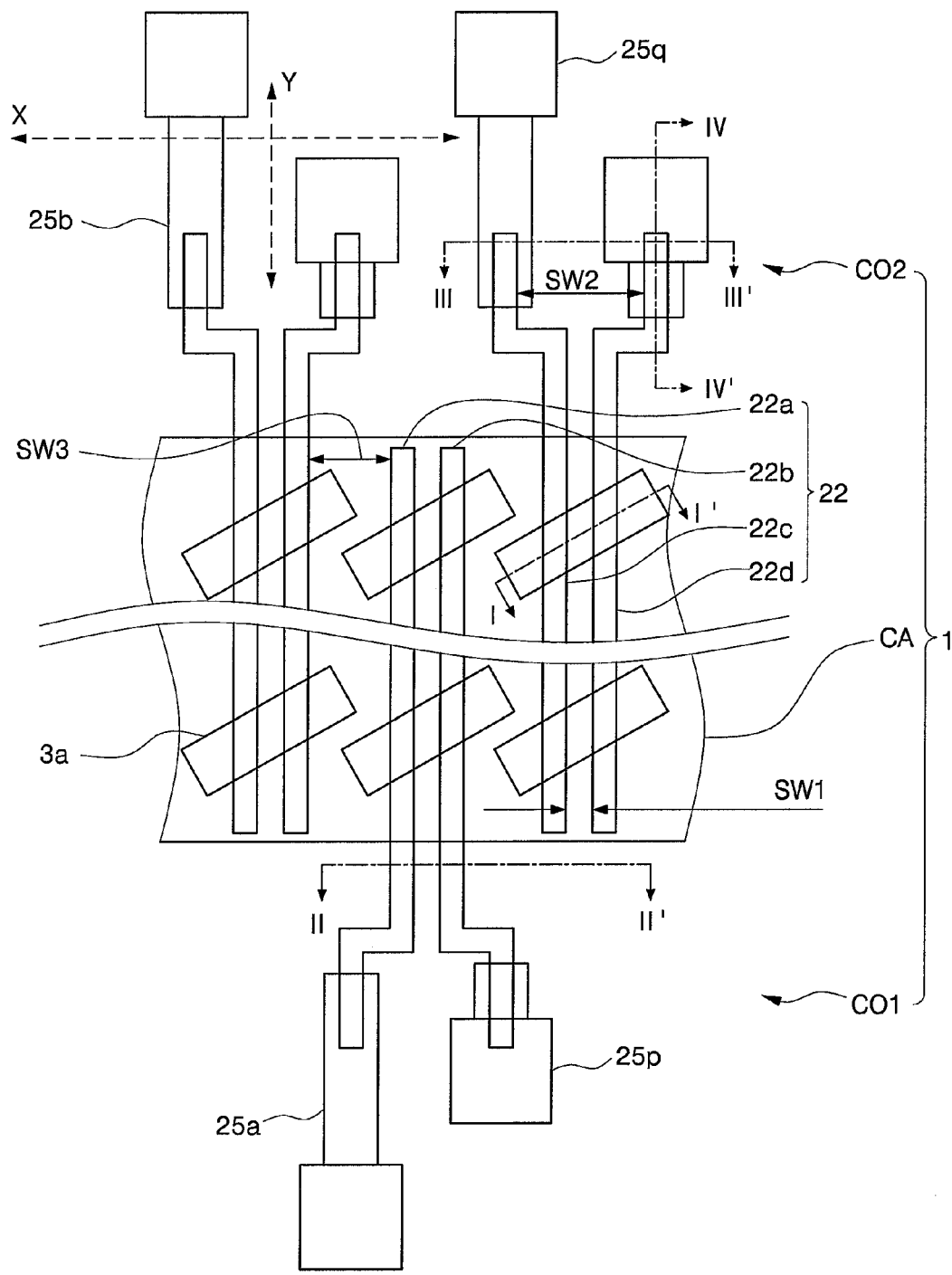
FIGS. 1 through 10 are plan views of semiconductor devices according to various exemplary disclosed embodiments.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements.

FIGS. 1 through 10 are plan views of semiconductor devices according to various exemplary disclosed embodiments. Referring to FIG. 1, in an exemplary disclosed embodiment, a semiconductor substrate 1 having a first core region CO1 and a second core region CO2 is provided. Furthermore, a cell array region CA is interposed between the first and second core regions CO1 and CO2. A plurality of active cell regions 3a may be provided in the cell array region CA. Furthermore, the active cell regions 3a may be defined by an isolation layer.

A plurality of conductive lines 22 are provided across the cell array region CA. These conductive lines 22 extend to the first core region CO1 or the second core region CO2. In the cell array region CA, the conductive lines 22 have a line width smaller than the resolution limit in a lithography process. These conductive lines 22 may be formed using various fabrication techniques. For example, the conductive lines 22 may be obtained by a spacer image pattern forming process.

The conductive lines 22 may be word lines or bit lines. In this case, the word lines may be buried gate lines. When the conductive lines 22 are word lines, the word lines may be disposed across the active cell regions 3a in the cell array region CA. Furthermore, the word lines, i.e., the buried gate lines, may be disposed lower than top surfaces of the active cell regions 3a.

The conductive lines 22 may include a first conductive line 22a, a second conductive line 22b, a third conductive line 22c, and a fourth conductive line 22d, that are arranged in sequence.

The first and second conductive lines 22a and 22b may extend to the first core region CO1 across the cell array region CA. Furthermore, the first and second conductive lines 22a and 22b may be spaced apart from each other by a first distance SW1 in the cell array region CA and have portions spaced apart from each other by a second distance SW2 in the first core region CO1. Here, the second distance SW2 is greater than the first distance SW1. Also, the first distance SW1 may be smaller than the resolution limit in a lithography process.

The third and fourth conductive lines 22c and 22d may extend to the second core region CO2 across the cell array region CA. The third and fourth conductive lines 22c and 22d may be spaced apart from each other by the first distance SW1 in the cell array region CA, and have portions spaced apart from each other by the second distance SW2 in the second core region CO2.

In the cell array region CA, the second and third conductive lines 22b and 22c may be spaced apart from each other by a third distance SW3 that is greater than the first distance SW1.

First and second contact pads 25p and 25q are electrically connected to one end portions of both end portions of each of the conductive lines 22, which are spaced apart from each other by the second distance SW2. Specifically, the first contact pads 25p may be electrically connected to end portions of the first and second conductive lines 22a and 22b in the first core region CO1, and the second contact pads 25q may be electrically connected to end portions of the third and fourth conductive lines 22c and 22d in the second core region CO2. Furthermore, each of the first and second contact pads 25p and 25q may have a width greater than the line width of each of the conductive lines 22.

The first contact pads 25p located in the first core region CO1 may be arranged diagonally adjacent to each other. Specifically, the first contact pads 25p may be spaced apart from one another such that a virtual horizontal line X and a virtual vertical line Y, which are spaced apart from the first contact pads 25p, run between the adjacent first contact pads 25p. Here, the virtual horizontal line X may be at an angle to the conductive lines 22 in the cell array region CA, while the virtual vertical line Y may be at a right angle to the virtual horizontal line X.

The second contact pads 25q located in the second core region CO2 may be arranged diagonally adjacent to each other. Specifically, the second contact pads 25q may be spaced apart from one another such that a virtual horizontal line X and a virtual vertical line Y, which are spaced apart from the second contact pads 25q, run between the adjacent second contact pads 25q.

First connection portions 25a may be provided between the end portions of the first and second conductive lines 22a and 22b of the first core region CO1 and the first contact pads 25p. The first connection portions 25a may electrically connect the first and second conductive lines 22a and 22b to the first contact pads 25p. Similarly, second connection portions 25b may be provided between the end portions of the third and fourth conductive lines 22c and 22d of the second core region CO2 and the second contact pads 25q. The second connection portions 25b may electrically connect the third and fourth conductive lines 22c and 22d to the second conductive pads 25q. Furthermore, each of the first and second connection portions 25a and 25b may have a width greater than the line width of each of the conductive lines 22, and smaller than the width of each of the first and second contact pads 25p and 25q.

Alternatively, conductive lines may be disposed along an active cell region in a different manner. Specifically, unlike the exemplary embodiment described above where the conductive lines 22 have end portions on substantially the same level in one of the first core region CO1 and the second core region CO2, in an alternative exemplary embodiment, as shown in FIG. 2, conductive lines 122 are disposed such that there is no need for connection portions 25a and 25b.

Figure 2:
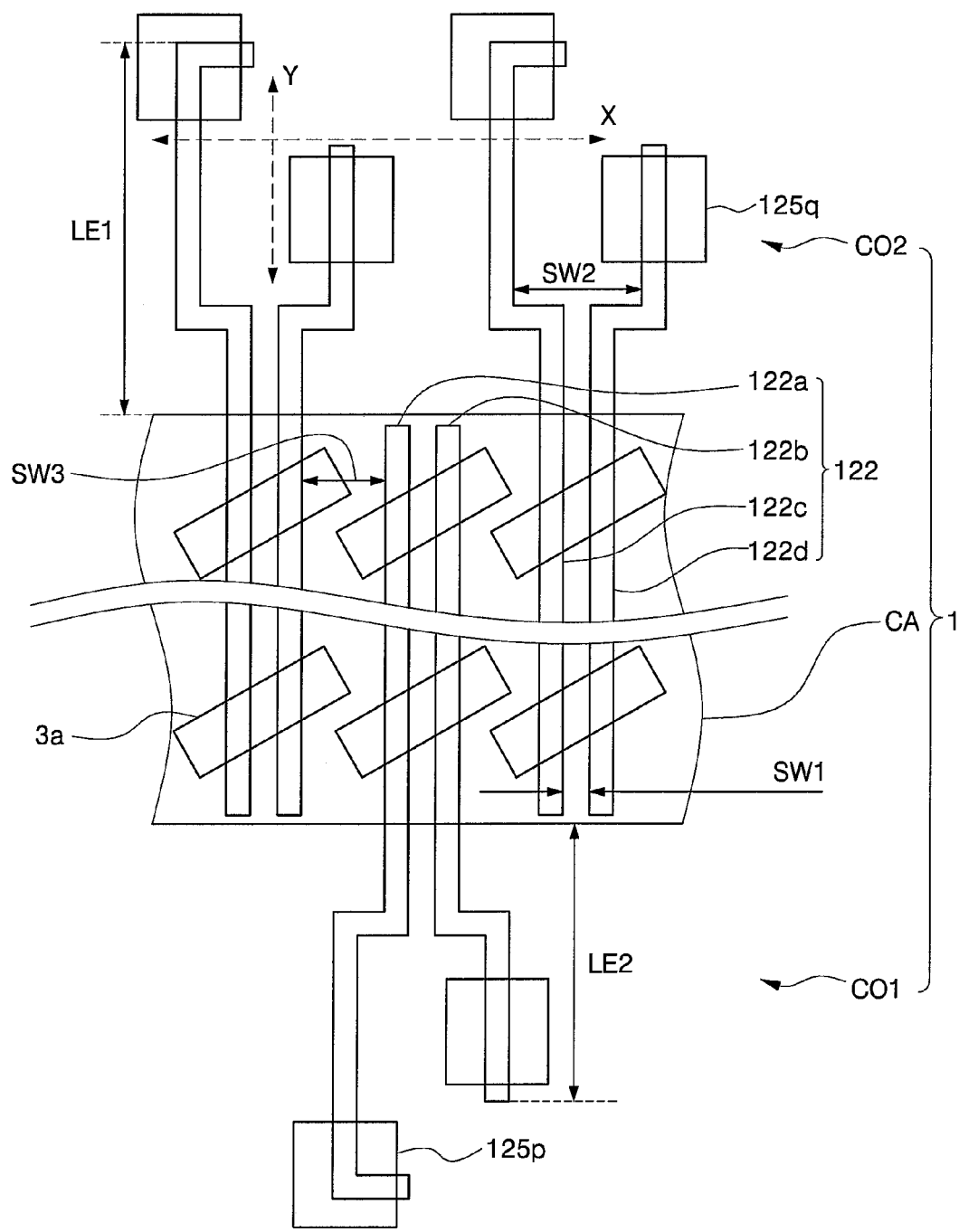

Referring to FIG. 2, conductive lines 122 extend to a first core region CO1 or a second core region CO2 across a cell array region CA. In this case, the conductive lines 122 may include first, second, third, and fourth conductive lines 122a, 122b, 122c, and 122d that are arranged in sequence. In the cell array region CA, each of the conductive lines 122 may have a line width smaller than the resolution limit in a lithography process.

The first and second conductive lines 122a and 122b may extend to the first core region CO1 across the cell array region CA. Furthermore, the first and second conductive lines 122a and 122b may be spaced apart from each other by a first distance SW1 in the cell array region CA and have portions spaced apart from each other in the first core region CO1 by a second distance SW2 that is greater than the first distance SW1. Here, the first conductive line 122a may extend by a first length LE1 from the cell array region CA to the first core region CO1, and the second conductive line 122b may extend by a second length LE2 from the cell array region CA to the first core region CO1. The second length LE2 is smaller than the first length LE1.

The third and fourth conductive lines 122c and 122d may extend to the second core region CO2 across the cell array region CA. The third and fourth conductive lines 122c and 122d may be spaced apart from each other by the first distance SW1 in the cell array region CA and have portions spaced apart from each other by the second distance SW2 in the second core region CO2. Here, the third conductive line 122c may extend by the first length LE1 from the cell array region CA to the second core region CO2, and the fourth conductive line 122d may extend by the second length LE2 from the cell array region CA to the second core region CO2. The first distance SW1 may be smaller than the resolution limit in a lithography process.

First and second contact pads 125p and 125q are electrically connected to end portions of both end portions of each of the conductive lines 122, which are spaced apart from each other by the second distance SW2. Specifically, the first contact pads 125p may overlap end portions of the first and second conductive lines 122a and 122b in the first core region CO1, and the second contact pads 125q may overlap end portions of the third and fourth conductive lines 122c and 122d in the second core region CO2. Furthermore, each of the first and second contact pads 125p and 125q may have a width greater than the line width of each of the conductive lines 122.

The first contact pads 125p located in the first core region CO1 may be arranged diagonally adjacent to each other. Specifically, the first contact pads 125p may be spaced apart from one another such that a virtual horizontal line X and a virtual vertical line Y, which are spaced apart from the first contact pads 125p, run between the adjacent first contact pads 125p. Here, the virtual horizontal line X may be at an angle to the conductive lines 122 in the cell array region CA, and the virtual vertical line Y may be at a right angle to the virtual horizontal line X.

The second contact pads 125q located in the second core region CO2 may also be arranged diagonally adjacent to each other. Specifically, the second contact pads 125q may be spaced apart from one another such that a virtual horizontal line X and a virtual vertical line Y, which are spaced apart from the second contact pads 125q, run between the adjacent second contact pads 125q.

As described above, the conductive lines 122 according to the above-described exemplary embodiment extend in the first and second core regions CO1 and CO2 by different lengths from the conductive lines 22 according to the first embodiment of the present invention. Also, the contact pads 125p and 125q of this embodiment may be on substantially the same level as the contact pads 25p and 25q of the previously embodiment in the first and second core regions CO1 and CO2.

Figure 3:
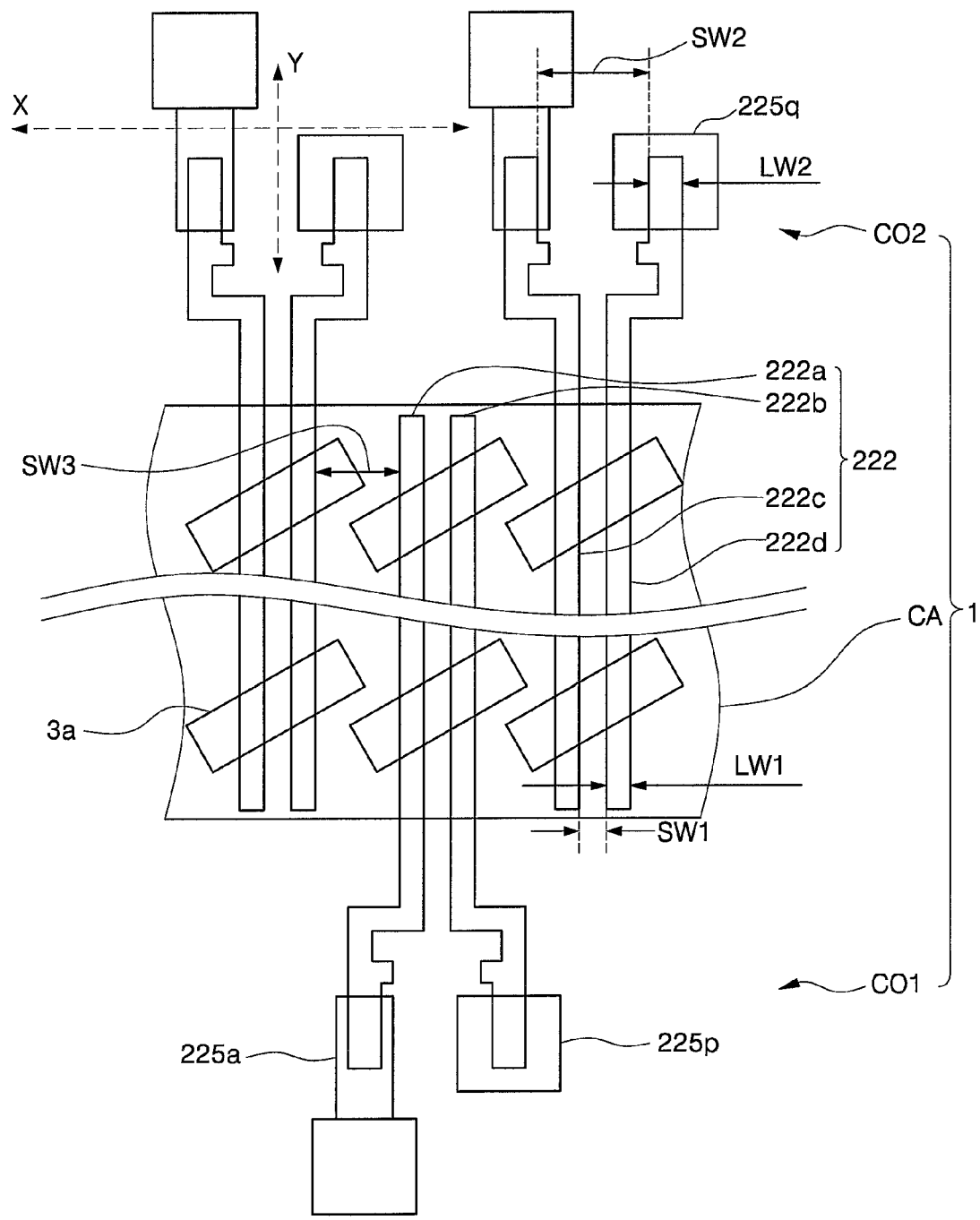

FIG. 3 represents an alternative structure and method for disposing conductive lines across an active cell region. Specifically, in FIG. 3, each of the conductive lines 222 has a greater line width in the first core region CO1 or the second core region CO2 than in the cell array region CA.

Still referring to FIG. 3, the conductive lines 222 may include first, second, third, and fourth conductive lines 222a, 222b, 222c, and 222d that are arranged in sequence. In the cell array region CA, the conductive lines 222 may have a first line width LW1 smaller than the resolution limit in a lithography process. Furthermore, the first and second conductive lines 222a and 222b may extend to the first core region CO1 across the cell array region CA. In addition, the first and second conductive lines 222a and 222b may be spaced apart from each other by a first distance SW1 in the cell array region CA and have portions spaced apart from each other in the first core region CO1 by a second distance SW2 that is greater than the first distance SW1. Here, the portions of the first and second conductive lines 222a and 222b which are spaced apart from each other by the second distance SW2 in the first core region CO1 may have a second line width LW2 greater than the first line width LW1. The first distance SW1 may be smaller than the resolution limit in a lithography process.

The third and fourth conductive lines 222c and 222d may extend to the second core region CO2 across the cell array region CA. The third and fourth conductive lines 222c and 222d may be spaced apart from each other by the first distance SW1 in the cell array region CA and have portions spaced apart from each other by the second distance SW2 in the second core region CO2. Here, the portions of the third and fourth conductive lines 222c and 222d which are spaced apart from each other by the second distance SW2 in the second core region CO2 may have the second line width LW2. In the cell array region CA, the second and third conductive lines 222b and 222c may be spaced apart from each other by a third distance SW3 that is greater than the first distance SW1.

First and second contact pads 225p and 225q may be electrically connected to end portions of the conductive lines 222 that have the second line width LW2. Furthermore, similar to a previously disclosed exemplary embodiment, the first and second contact pads 225p and 225q may be on substantially the same level. Therefore, connection portions 225a may be provided between the contact pads 225p and the end portions of the conductive lines 222 like a previously disclosed embodiment. As described above, the conductive lines 222 of the third embodiment have a different line width from the conductive lines 22 in a previously disclosed embodiment in the first and second core regions CO1 and CO2. As a result, in the present embodiment, an electrical characteristic between the conductive lines 222 and the contact pads 225p can be improved.

Figure 4:
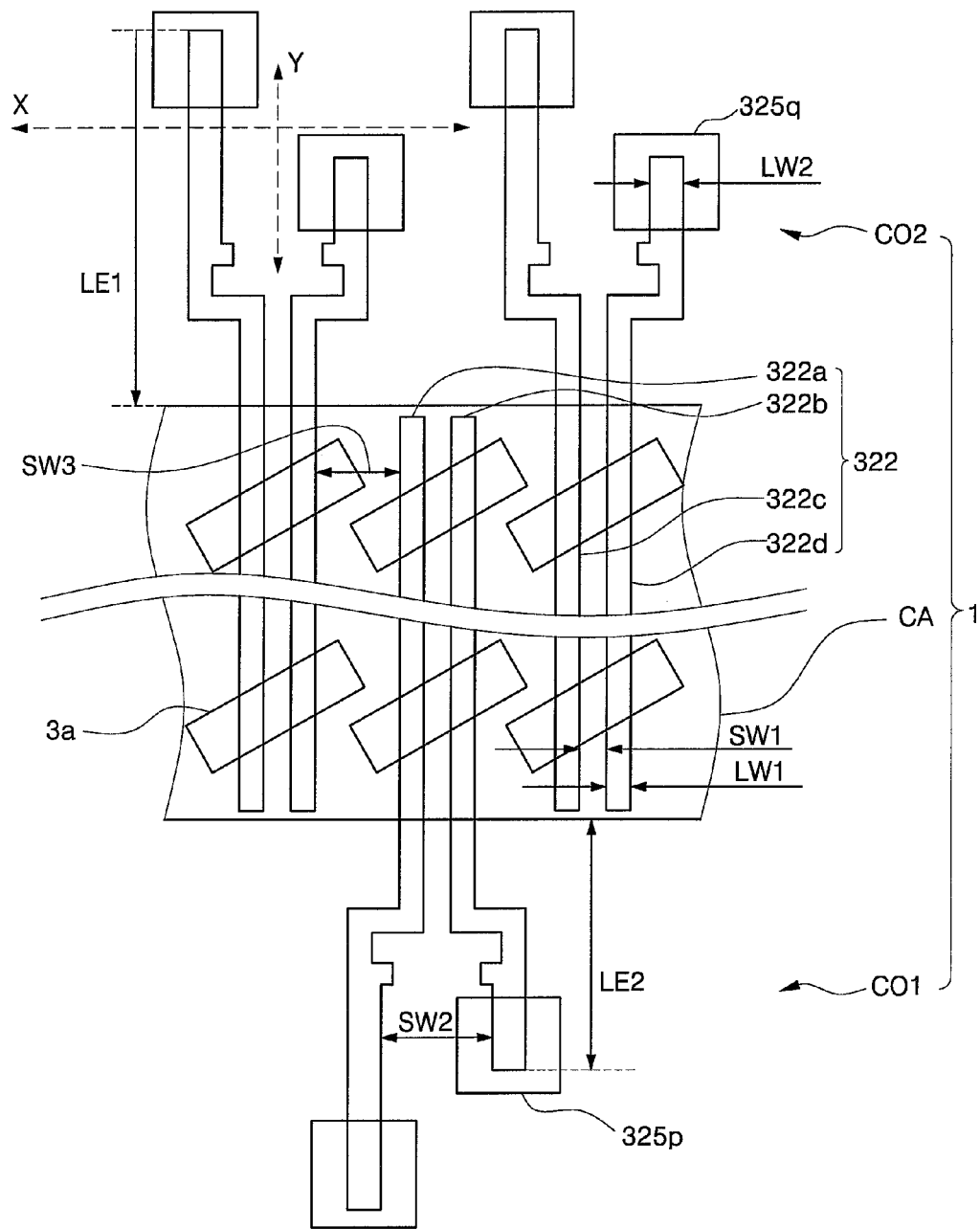

In yet another exemplary embodiment, the conductive lines 222 described above are disposed in a manner such that the connection portions 225a are omitted. FIG. 4 illustrates such an exemplary disclosed embodiment.

Specifically, referring to FIG. 4, conductive lines 322 extend to a first core region CO1 or a second core region CO2 across a cell array region CA. In this case, the conductive lines 322 may include first, second, third, and fourth conductive lines 322a, 322b, 322c, and 322d that are arranged in sequence. In the cell array region CA, each of the conductive lines 322 may have a line width smaller than the resolution limit in a lithography process.

The first and second conductive lines 322a and 322b may extend to the first core region CO1 across the cell array region CA. The first and second conductive lines 322a and 322b may be spaced apart from each other by a first distance SW1 in the cell array region CA and have portions spaced apart from each other in the first core region CO1 by a second distance SW2 that is greater than the first distance SW1. Here, the portions of the first and second conductive lines 322a and 322b which are spaced apart from each other by the second distance SW2 in the first core region CO1 may have a second line width LW2 greater than the first line width LW1. The first distance SW1 may be smaller than the resolution limit in a lithography process. Also, the first conductive line 322a may extend by a first length LE1 from the cell array region CA to the first core region CO1, and the second conductive line 322b may extend from the cell array region CA to the first core region CO1 by a second length LE2 that is smaller than the first length LE1.

The third and fourth conductive lines 322c and 322d may extend to the second core region CO2 across the cell array region CA. Furthermore, the third and fourth conductive lines 322c and 322d may be spaced apart from each other by the first distance SW1 in the cell array region CA and have portions spaced apart from each other by the second distance SW2 in the second core region CO2. Here, the portions of the third and fourth conductive lines 322c and 322d which are spaced apart from each other by the second distance SW2 in the second core region CO2 may have the second line width LW2. Additionally, in the cell array region CA, the second and third conductive lines 322b and 322c may be spaced apart from each other by a third distance SW3 that is greater than the first distance SW1.

The third conductive line 322c may extend by the first length LE1 from the cell array region CA to the second core region CO2, and the fourth conductive line 322d may extend by the second length LE2 from the cell array region CA to the second core region CO2.

First and second contact pads 325p and 325q may be electrically connected to end portions of the conductive lines 322 that have the second line width LW2. Specifically, the first contact pads 325p may overlap end portions of the first and second conductive lines 322a and 322b in the first core region CO1, and the second contact pads 325q may overlap end portions of the third and fourth conductive lines 322c and 322d in the second core region CO2. Each of the first and second contact pads 325p and 325q may have a width greater than the line width of each of the conductive lines 322.

The first contact pads 325p located in the first core region CO1 may be arranged diagonally adjacent to each other. Specifically, the first contact pads 325p may be spaced apart from one another such that a virtual horizontal line X and a virtual vertical line Y, which are spaced apart from the first contact pads 325p, run between the adjacent first contact pads 325p. Here, the virtual horizontal line X may be at an angle to the conductive lines 322 in the cell array region CA, while the virtual vertical line Y may be at a right angle to the virtual horizontal line X.

Similarly, the second contact pads 325q located in the second core region CO2 may be arranged diagonally adjacent to each other. Specifically, the second contact pads 325q may be spaced apart from one another such that a virtual horizontal line X and a virtual vertical line Y, which are spaced apart from the second contact pads 325q, run between the adjacent second contact pads 325q.

Figure 5:
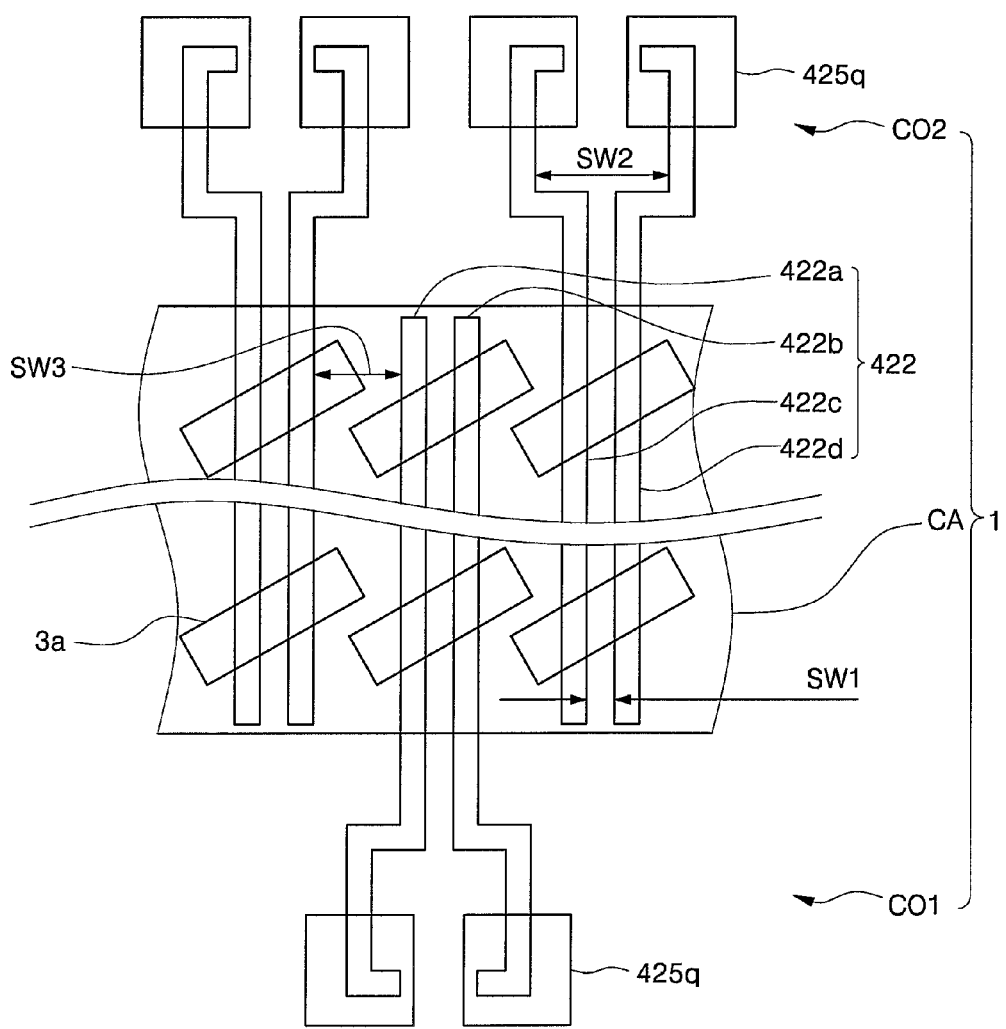

In the meantime, the contact pads 25p according to a previously disclosed embodiment may be disposed as shown in FIG. 5 that illustrates yet another alternative exemplary embodiment. In particular, conductive lines 422 of the present embodiment may be disposed in substantially the same position as the conductive lines 22 of a previously disclosed embodiment. The conductive lines 422 may include first, second, third, and fourth conductive lines 422a, 422b, 422c, and 422d which are arranged in sequence. The first and second conductive lines 422a and 422b may extend to a first core region CO1 across a cell array region CA. The first and second conductive lines 422a and 422b may be spaced apart from each other by a first distance SW1 in the cell array region CA and have portions spaced apart from each other in the core region CO1 by a second distance SW2 that is greater than the first distance SW1. Here, the first distance SW1 may be smaller than the resolution limit in a lithography process.

The third and fourth conductive lines 422c and 422d may extend to the second core region CO2 across the cell array region CA. The third and fourth conductive lines 422c and 422d may be spaced apart from each other by the first distance SW1 in the cell array region CA and have portions spaced apart from each other by the second distance SW2 in the second core region CO2. In the cell array region CA, the second and third conductive lines 422b and 422c may be spaced apart from each other by a third distance SW3 that is greater than the first distance SW1. Furthermore, contact pads 425p and 425q may overlap one end portions of both end portions of the conductive lines 422 that are spaced apart from one another by the second distance SW2.

Figure 6:
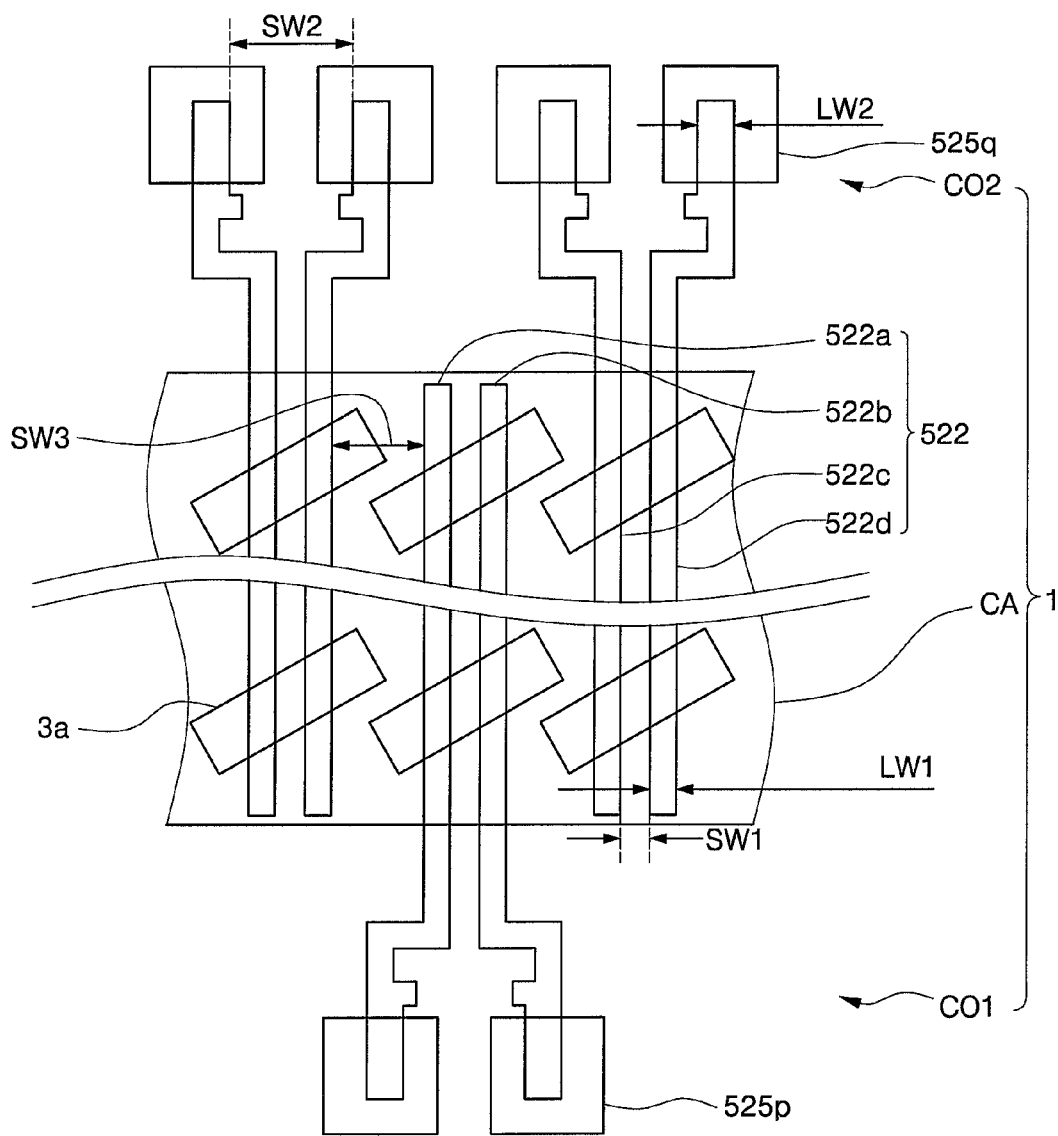

In another alternative exemplary embodiment, the conductive lines 422 according to the embodiment described above, may be disposed differently as shown in FIG. 6. As described above, in an exemplary embodiment, each of the conductive lines 422 has a portion that extends to the first core region CO1 or the second core region CO2 and has a line width smaller than the resolution limit in a lithography process. In contrast, the conductive lines 522 in FIG. 6 may have a greater line width in the first core region CO1 or the second core region CO2 than in the cell array region CA.

Specifically, the conductive lines 522 may include first, second, third, and fourth conductive lines 522a, 522b, 522c, and 522d that are arranged in sequence. In the cell array region CA, the conductive lines 522 may have a first line width LW1 smaller than the resolution limit in a lithography process. Furthermore, the first and second conductive lines 522a and 522b may extend to the first core region CO1 across the cell array region CA. The first and second conductive lines 522a and 522b may be spaced apart from each other by a first distance SW1 in the cell array region CA and have portions spaced apart from each other in the first core region CO1 by a second distance SW2 that is greater than the first distance SW1. Here, the portions of the first and second conductive lines 522a and 522b which are spaced apart from each other by the second distance SW2 in the first core region CO1 may have a second line width LW2 greater than the first line width LW1. The first distance SW1 may be smaller than the resolution limit in a lithography process.

The third and fourth conductive lines 522c and 522d may extend to the second core region CO2 across the cell array region CA. The third and fourth conductive lines 522c and 522d may be spaced apart from each other by the first distance SW1 in the cell array region CA and have portions spaced apart from each other by the second distance SW2 in the second core region CO2. Here, the portions of the third and fourth conductive lines 522c and 522d which are spaced apart from each other by the second distance SW2 in the second core region CO2 may have the second line width LW2. In the cell array region CA, the second and third conductive lines 522b and 522c may be spaced apart from each other by a third distance SW3 that is greater than the first distance SW1. Furthermore, second contact pads 525p and 525q may overlap end portions of the conductive lines 522 that have the second line width LW2.

Figure 7:
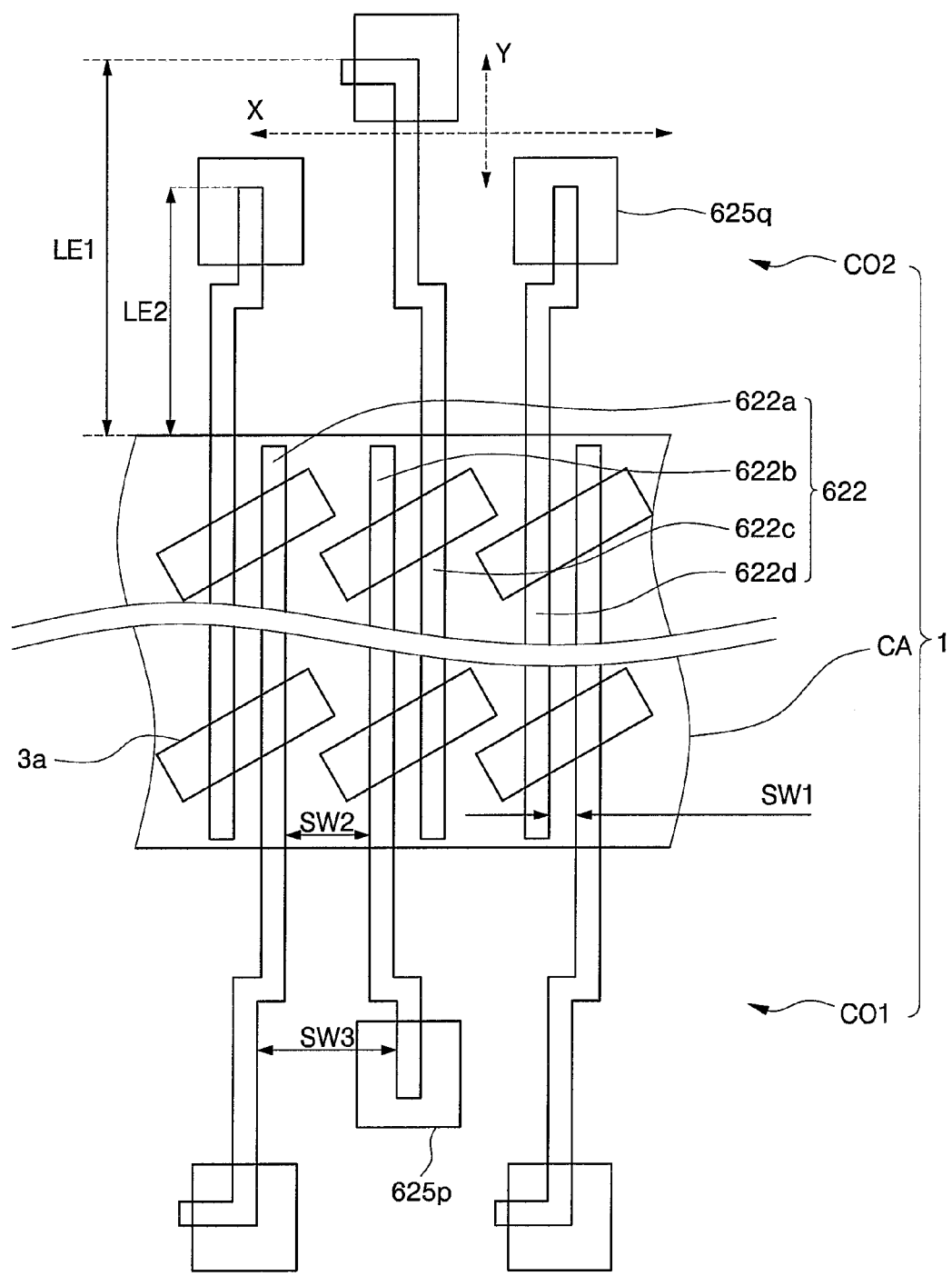

A semiconductor device according to yet another alternative exemplary embodiment will now be described with reference to FIG. 7. Referring to FIG. 7, a semiconductor substrate 1, which is the same as that disclosed in previous embodiments, is provided. The semiconductor substrate 1 may have a first core region CO1 and a second core region CO2. A cell array region CA may be interposed between the first and second core regions CO1 and CO2. A plurality of active cell regions 3a may be provided in the cell array region CA. The active cell regions 3a may be defined by an isolation layer (not shown). Furthermore, a plurality of conductive lines 622 extend to the first core region CO1 or the second core region CO2 across the cell array region CA. The conductive lines 622 may be buried gate lines or bit lines.

Specifically, the conductive lines 622 may include first, second, third, and fourth conductive lines 622a, 622b, 622c, and 622d that are arranged in sequence. In the cell array region CA, the conductive lines 622 may have a line width smaller than the resolution limit in a lithography process. Also, the second and third conductive lines 622b and 622c in the cell array region CA may be spaced apart from each other by a first distance SW1 that is smaller than the resolution limit in a lithography process. The first and second conductive lines 622a and 622b may extend to the first core region CO1 across the cell array region CA. Furthermore, the first and second conductive lines 622a and 622b may be spaced apart from each other by a second distance SW2 in the cell array region CA and have portions spaced apart from each other by a third distance SW3 in the first core region CO1. Here, the second distance SW2 is greater than the first distance SW1 and smaller than the third distance SW3. Also, the first conductive line 622a may extend by a first length LE1 from the cell array region CA to the first core region CO1, and the second conductive line 622b may extend from the cell array region CA to the first core region CO1 by a second length LE2 that is smaller than the first length LE1.

The third and fourth conductive lines 622c and 622d may extend to the second core region CO2 across the cell array region CA. The third and fourth conductive lines 622c and 622d may be spaced apart from each other by the second distance SW2 in the cell array region CA and have portions spaced apart from each other by the third distance SW3 in the second core region CO2. Here, the third conductive line 622c may extend by the first length LE1 from the cell array region CA to the second core region CO2, and the fourth conductive line 622d may extend by the second length LE2 from the cell array region CA to the second core region CO2.

First and second contact pads 625p and 625q may be electrically connected to end portions of the conductive lines 622 that are spaced apart from one another by the second distance SW2. Specifically, the first contact pads 625p may overlap end portions of the first and second conductive lines 622a and 622b and the second contact pads 625q may overlap end portions of the third and fourth conductive lines 622c and 622d. Each of the first and second contact pads 625p and 625q may have a width greater than the line width of each of the conductive lines 622.

The first contact pads 625p located in the first core region CO1 may be arranged diagonally adjacent to each other. Specifically, the first contact pads 625p may be spaced apart from one another such that a virtual horizontal line X and a virtual vertical line Y, which are spaced apart from the first contact pads 625p, run between the adjacent first contact pads 625p. Here, the virtual horizontal line X may be at an angle to the conductive lines 622 in the cell array region CA, while the virtual vertical line Y may be at a right angle to the virtual horizontal line X.

The second contact pads 625q located in the second core region CO2 may be arranged diagonally adjacent to each other. Specifically, the second contact pads 625q may be spaced apart from one another such that a virtual horizontal line X and a virtual vertical line Y, which are spaced apart from the second contact pads 625q, run between the adjacent second contact pads 625q.

Figure 8:
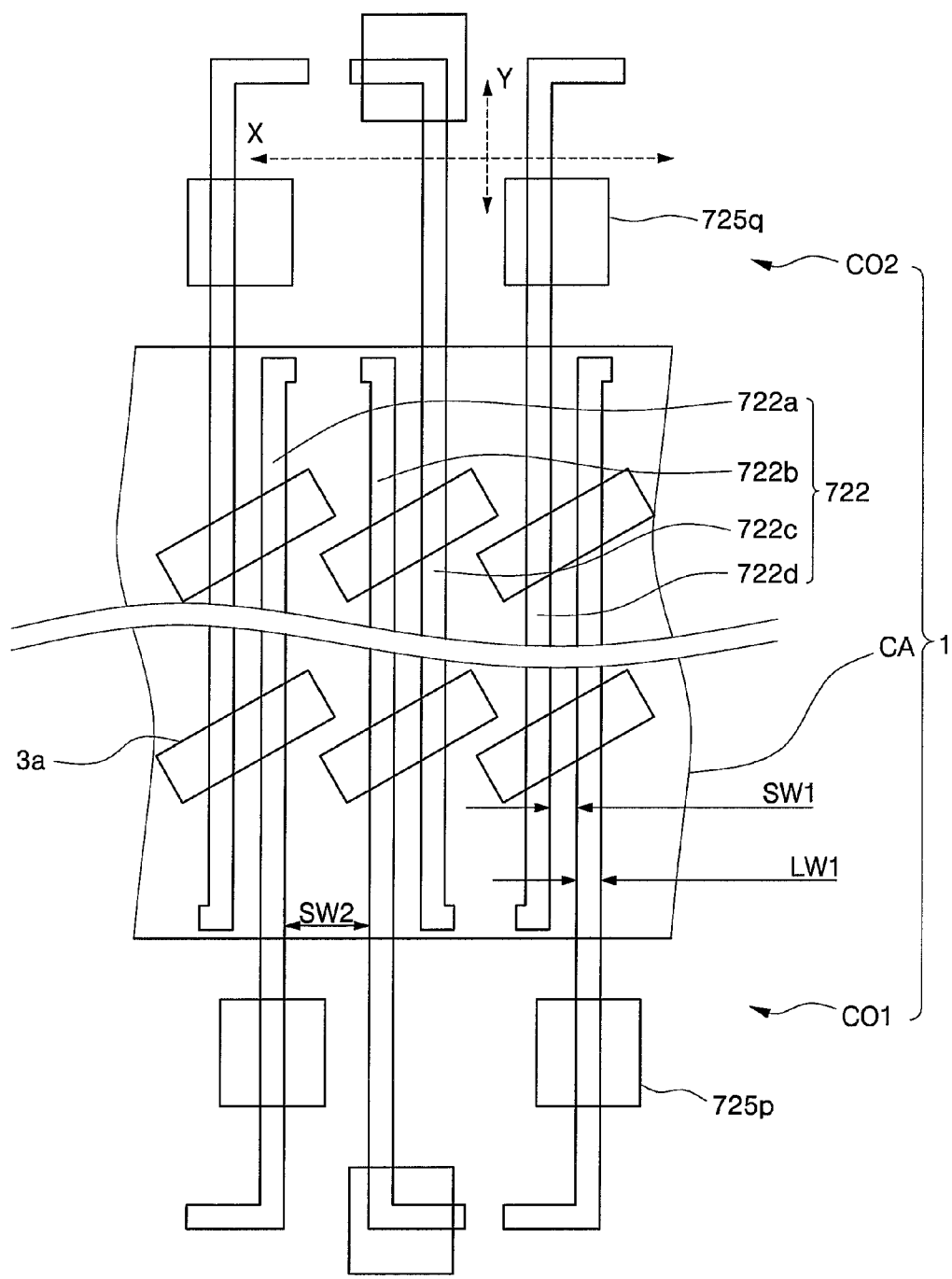

A semiconductor device according to yet another alternative exemplary embodiment will now be described with reference to FIG. 8. Referring to FIG. 8, a semiconductor substrate 1, which is the same as that disclosed in previously discussed embodiments, is provided. The semiconductor substrate 1 may have a first core region CO1 and a second core region CO2. A cell array region CA is interposed between the first and second core regions CO1 and CO2. A plurality of active cell regions 3a may be provided in the cell array region CA. The active cell regions 3a may be defined by an isolation layer (not shown). A plurality of conductive lines 722 extend to the first core region CO1 or the second core region CO2 across the cell array region CA. The conductive lines 722 may be buried gate lines or bit lines.

Specifically, the conductive lines 722 may include first, second, third, and fourth conductive lines 722a, 722b, 722c, and 722d that are arranged in sequence. In the cell array region CA, the conductive lines 722 may have a line width smaller than the resolution limit in a lithography process.

In the cell array region CA, the second and third conductive lines 722b and 722c may be spaced apart from each other by a first distance SW1 that is smaller than the resolution limit in a lithography process.

The first and second conductive lines 722a and 722b may extend to the first core region CO1 across the cell array region CA. The first and second conductive lines 722a and 722b may be spaced apart from each other by a second distance SW2 that is greater than the first distance SW1. The third and fourth conductive lines 722c and 722d may extend to the second core region CO2 across the cell array region CA. The third and fourth conductive lines 722c and 722d may be spaced apart from each other by the second distance SW2.

First contact pads 725p may overlap the first and second conductive lines 722a and 722b in the first core region CO1, and second contact pads 725q may overlap the third and fourth conductive lines 722c and 722d in the second core region CO2. Each of the first and second contact pads 725p and 725q may have a line width greater than the line width of each of the conductive lines 722.

The first contact pads 725p located in the first core region CO1 may be arranged diagonally adjacent to each other. Specifically, the first contact pads 725p may be spaced apart from one another such that a virtual horizontal line X and a virtual vertical line Y, which are spaced apart from the first contact pads 725p, run between the adjacent first contact pads 725p. Here, the virtual horizontal line X may be at an angle to the conductive lines 722 in the cell array region CA, while the virtual vertical line Y may be at a right angle to the virtual horizontal line X.

The second contact pads 725q located in the second core region CO2 may be arranged diagonally adjacent to each other. Specifically, the second contact pads 725q may be spaced apart from one another such that a virtual horizontal line X and a virtual vertical line Y, which are spaced apart from the second contact pads 725q, run between the adjacent second contact pads 725q.

Figure 9:
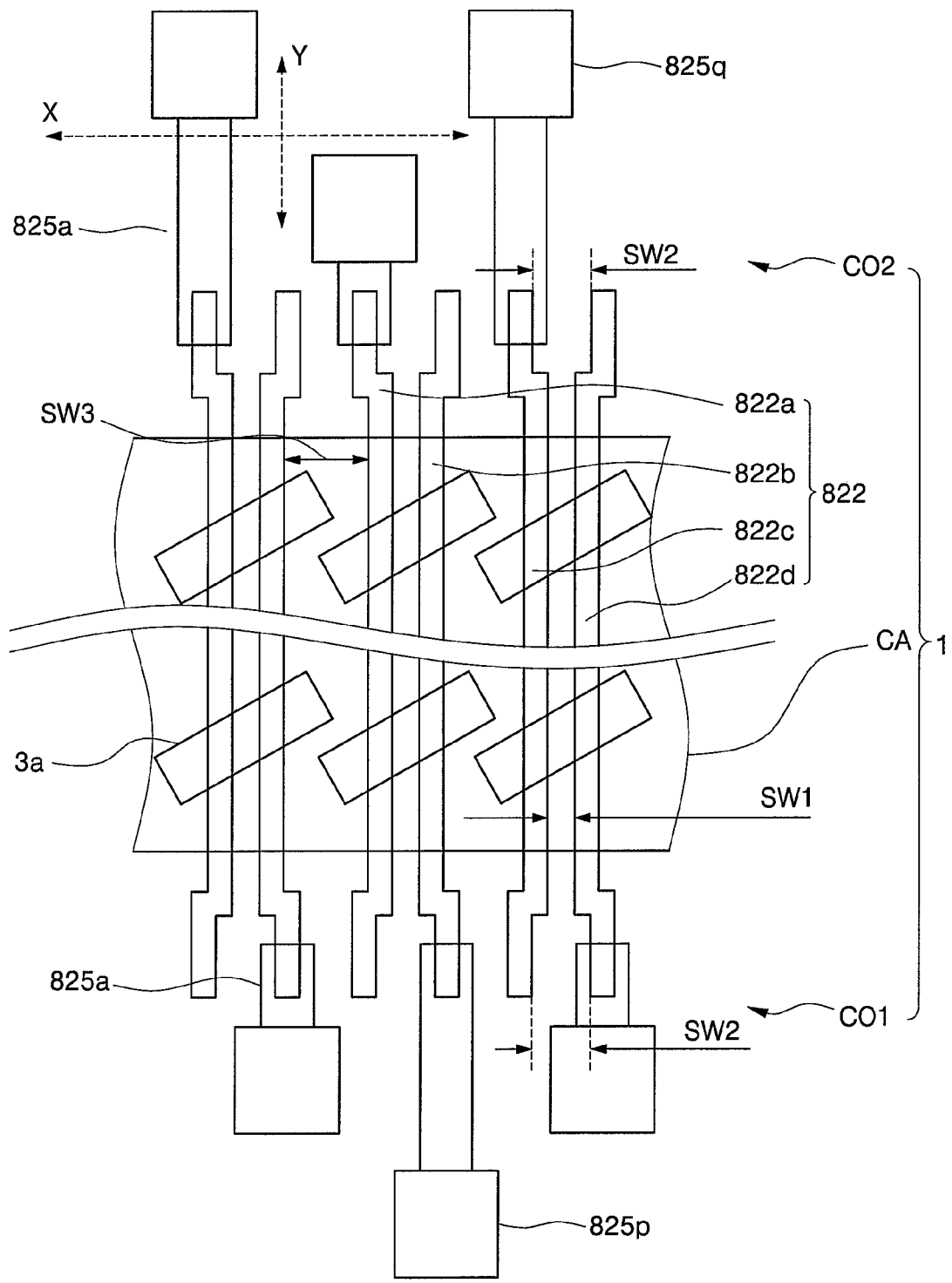

A semiconductor device according to another alternative exemplary embodiment will now be described with reference to FIG. 9. Referring to FIG. 9, a semiconductor substrate 1, which is the same as that previously discussed, is provided. The semiconductor substrate 1 may have a first core region CO1 and a second core region CO2. A cell array region CA is interposed between the first and second core regions CO1 and CO2. A plurality of active cell regions 3a may be provided in the cell array region CA. The cell array regions 3a may be defined by an isolation layer (not shown).

A plurality of conductive lines 822 extend to the first core region CO1 or the second core region CO2 across the cell array region CA. The conductive lines 822 have a line width smaller than the resolution limit in a lithography process. For example, the conductive lines 822 may be buried gate lines that are obtained by a spacer image pattern process. Furthermore, the conductive lines 822 may be disposed across the active cell regions 3a in the cell array region CA. In particular, when the conductive lines 822 are buried gate lines, they may be disposed lower than the top surfaces of the active cell regions 3a.

The conductive lines 822 may include first, second, third, and fourth conductive lines 822a, 822b, 822c, and 822d that are arranged in sequence. The first and second conductive lines 822a and 822b are spaced apart from each other by a first distance SW1 in the cell array region CA and have portions spaced apart from each other in the first and second core regions CO1 and CO2 by a second distance SW2 that is greater than the first distance SW1. Here, the first distance SW1 may be smaller than the resolution limit in a lithography process. The third and fourth conductive lines 822c and 822d are spaced apart from each other by the first distance SW1 in the cell array region CA and have portions spaced apart from each other by the second distance SW2 in the first and second core regions CO1 and CO2. In the cell array region CA, the second and third conductive lines 822b and 822c may be spaced apart from each other by a third distance SW3 that is greater than the first distance SW1.

First and second contact pads 825p and 825q may be electrically connected to selected end portions of the conductive lines 822. For example, the first contact pads 825p may be electrically connected to end portions of the second and fourth conductive lines 822b and 822d in the first core region CO1, and the second contact pads 825q may be electrically connected to end portions of the first and third conductive lines 822a and 822c in the second core region CO2. Furthermore, in an exemplary embodiment, the contact pads 825p and 825q disposed in one of the first and second core regions CO1 and CO2 may be arranged diagonally adjacent to each other.

Specifically, the first contact pads 825p may be spaced apart from one another such that a virtual horizontal line X and a virtual vertical line Y, which are spaced apart from the first contact pads 825p, run between the adjacent first contact pads 825p. Similarly, the second contact pads 825q may be spaced apart from one another such that a virtual horizontal line X and a virtual vertical line Y, which are spaced apart from the second contact pads 825q, run between the adjacent second contact pads 825q. The virtual horizontal line X may be at an angle to the conductive lines 822 in the cell array region CA, while the virtual vertical line Y may be at a right angle to the virtual horizontal line X.

When seen in a plan view, because the contact pads 825p and 825q are arranged diagonally adjacent to each other, the end portions of the conductive lines 822 may be spaced apart from end portions of the contact pads 825p and 825q. In this case, connection portions 825a may be provided between the end portions of the conductive lines 822 and the contact pads 825p and 825q so that the contact pads 825p and 825q can be electrically connected to the conductive lines 822.

Figure 10:
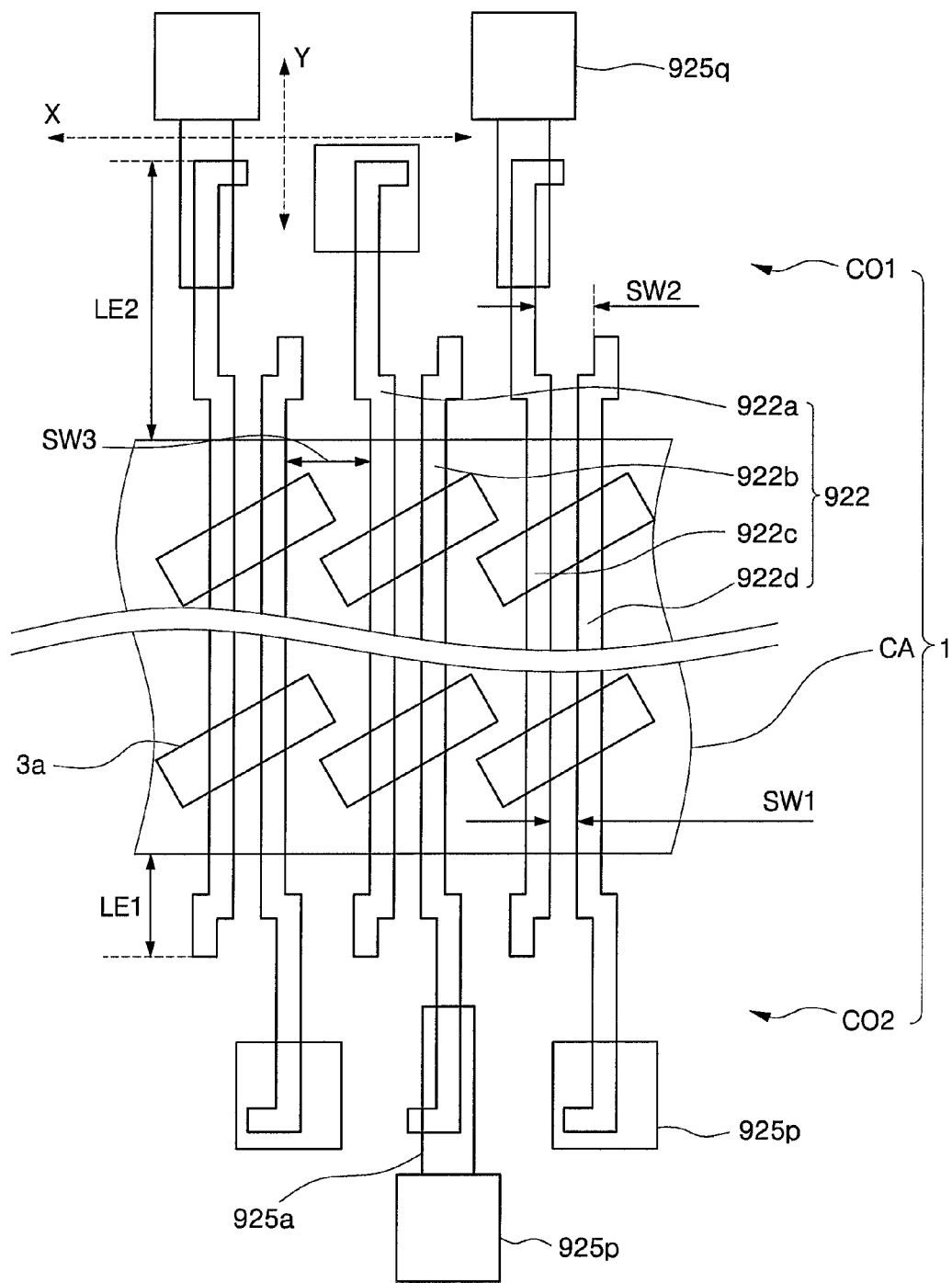

FIG. 10 illustrates yet another exemplary disclosed embodiment. Referring to FIG. 10, conductive lines 922 may have different lengths in first and second core regions CO1 and CO2 unlike the conductive lines 822 discussed with respect to a previously disclosed exemplary embodiment.

Specifically, the conductive lines 922 may include first, second, third, and fourth conductive lines 922a, 922b, 922c, and 922d that are arranged in sequence. The first and third conductive lines 922a and 922c may extend by a first length LE1 from the cell array region CA to the first core region CO1 and also, extend by a second length LE2 from the cell array region CA to the second core region CO2. Here, the second length LE2 is greater than the first length LE1. Also, the second and fourth conductive lines 922b and 922d may extend by the second length LE2 from the cell array region CA to the first core region CO1 and also, extend by the first length LE1 from the cell array region CA to the second core region CO2.

First and second contact pads 925p and 925q may be electrically connected to end portions of the conductive lines 922, which extend by the second length LE2 from the cell array region CA to the first and second core regions CO1 and CO2. Specifically, the first contact pads 925p may be electrically connected to end portions of the second and fourth conductive lines 922b and 922d in the first core region CO1, and the second contact pads 925q may be electrically connected to end portions of the first and third conductive lines 922a and 922c in the second core region CO2.

Furthermore, the first and second contact pads 925p and 925q which are disposed in one of the first and second core regions CO1 and CO2 may be arranged diagonally adjacent to each other. For example, the first contact pads 925p may be spaced apart from one another such that a virtual horizontal line X and a virtual vertical line Y, which are spaced apart from the first contact pads 925p, run between the adjacent first contact pads 925p. The second contact pads 925q may be spaced apart from one another such that a virtual horizontal line X and a virtual vertical line Y, which are spaced apart from the second contact pads 925q, run between the adjacent second contact pads 925q. The virtual horizontal line X may be at an angle to the conductive lines 822 in the cell array region CA, while the virtual vertical line Y may be at a right angle to the virtual horizontal line X.

When seen in a plan view, because the contact pads 925p and 925q are arranged diagonally adjacent to each other, the end portions of the conductive lines 922 may be spaced apart from end portions of the contact pads 925p and 925q. In this case, connection portions 925a may be provided between the end portions of the conductive lines 922 and the contact pads 925p and 925q so that the contact pads 925p and 925q can be electrically connected to the conductive lines 922.

As described above, the conductive lines of the semiconductor devices according to exemplary disclosed embodiments may have sub-resolution fine line widths in the cell array region. Also, a sufficient space may be secured between the contact pads provided in the core regions. As a result, the above-described semiconductor devices can improve the integration density of electronic equipment using such semiconductor devices.

Figure 11:
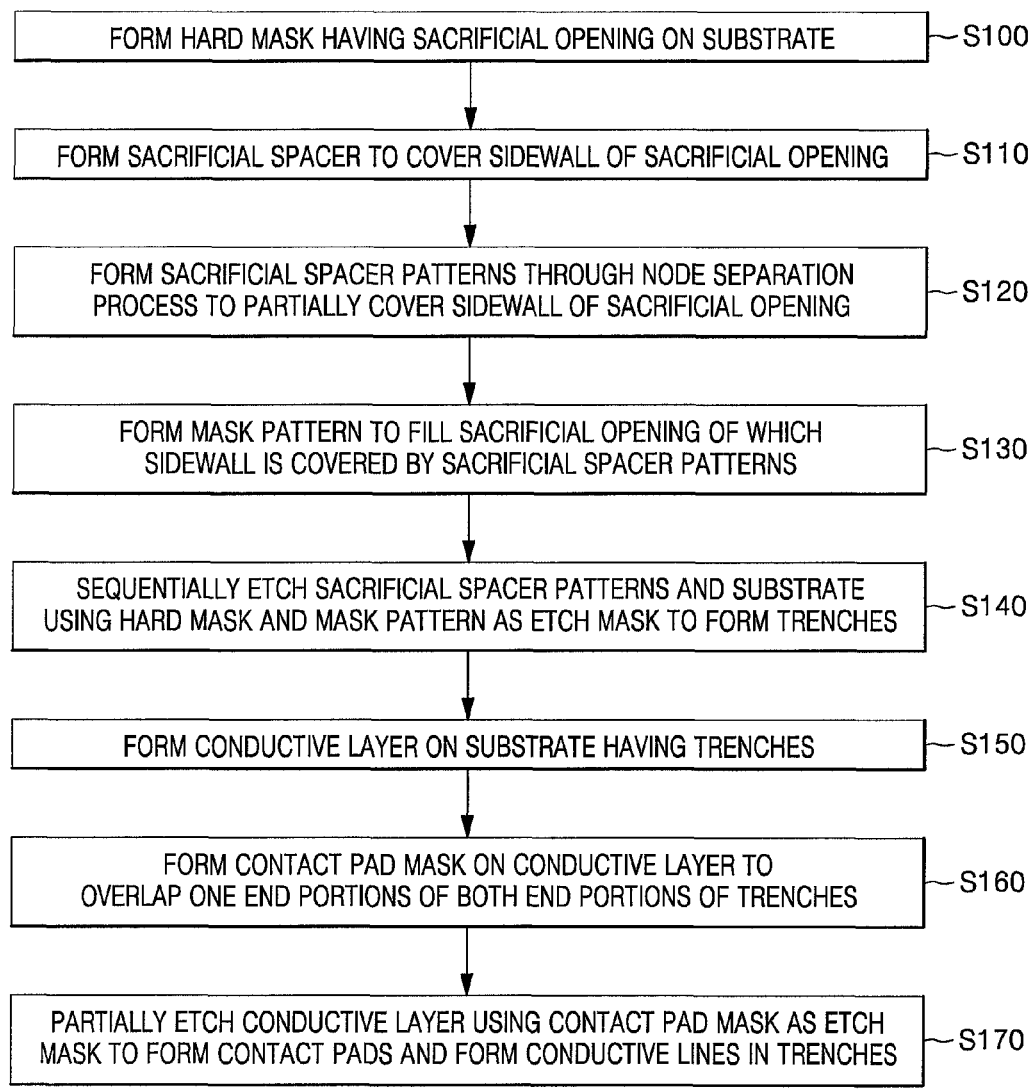
FIG. 11 is a process flowchart illustrating a method of fabricating a semiconductor device according to an exemplary disclosed embodiment.

Hereinafter, methods of fabricating semiconductor devices according to exemplary disclosed embodiments will be described. FIG. 11 is a process flowchart illustrating a common method of fabricating the semiconductor devices according to the exemplary embodiments discussed above. In other words, the semiconductor devices in the exemplary embodiments discussed above are fabricated in similar manners, but they are different in the arrangement of conductive lines and contact pads as described above with reference to FIGS. 1 through 10. Therefore, only a method of fabricating the semiconductor device according to one exemplary embodiment will now be described in detail.

First, a method of fabricating the semiconductor device according to an exemplary disclosed embodiment will be described with reference to FIGS. 1, 11, 12A through 12G, and 13A through 13E.

Referring to FIGS. 1, 11, 12A, and 13A, a semiconductor substrate 1 having a first core region CO1 and a second core region CO2 is prepared. A cell array region CA is interposed between the first and second core regions CO1 and CO2. An isolation layer 3S may be formed in the semiconductor substrate 1 to define active cell regions 3a in the cell array region CA. The isolation layer 3S may be formed using a trench isolation technique. In addition, a buffer dielectric layer 5, a buffer conductive layer 7, and a sacrificial insulating layer 9 may be sequentially formed on the semiconductor substrate 1 having the isolation layer 3S.

Figure 13A:
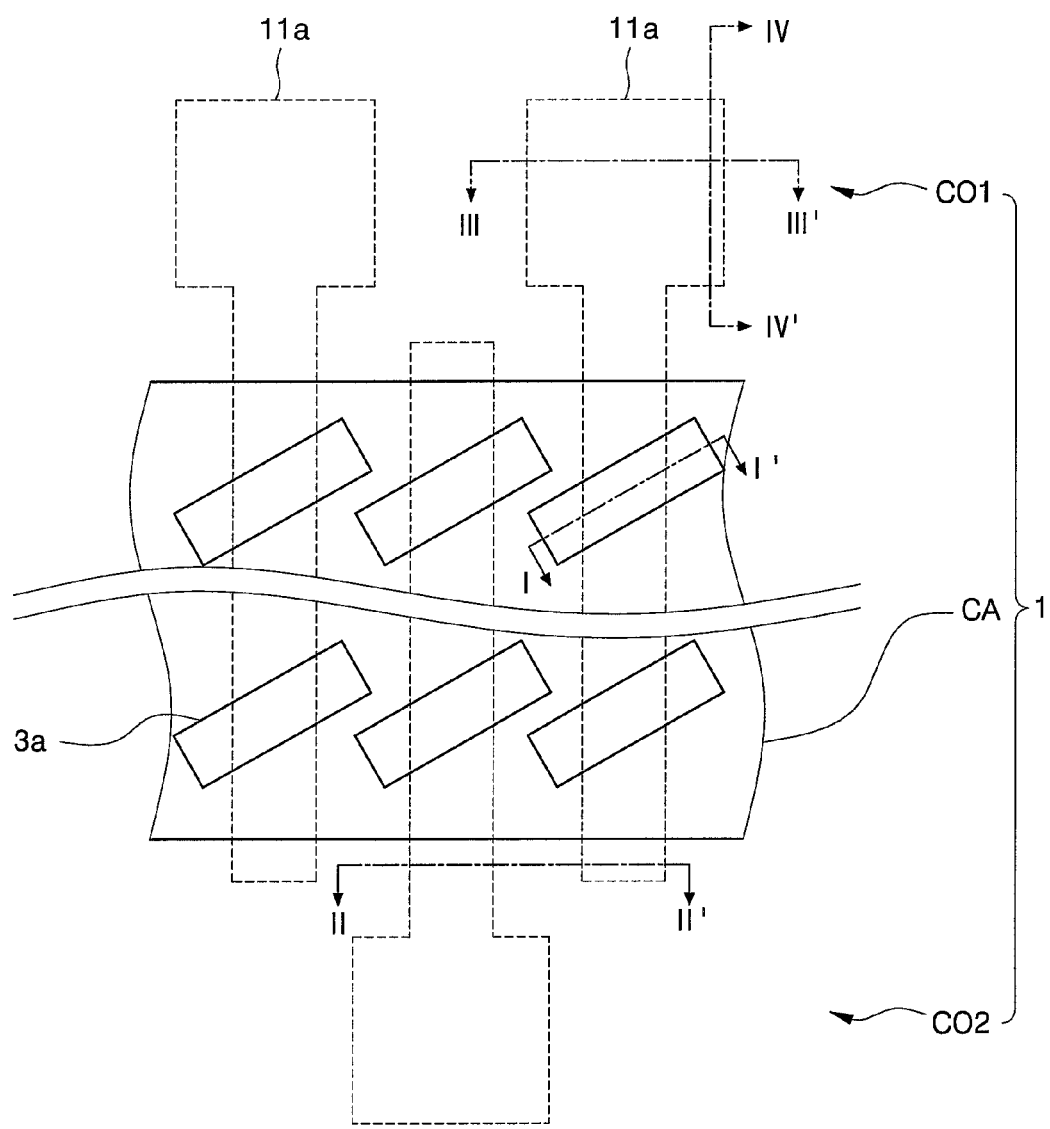
FIGS. 13A through 13E are plan views illustrating the method of fabricating the semiconductor device according to an exemplary disclosed embodiment.
Figure 13B:
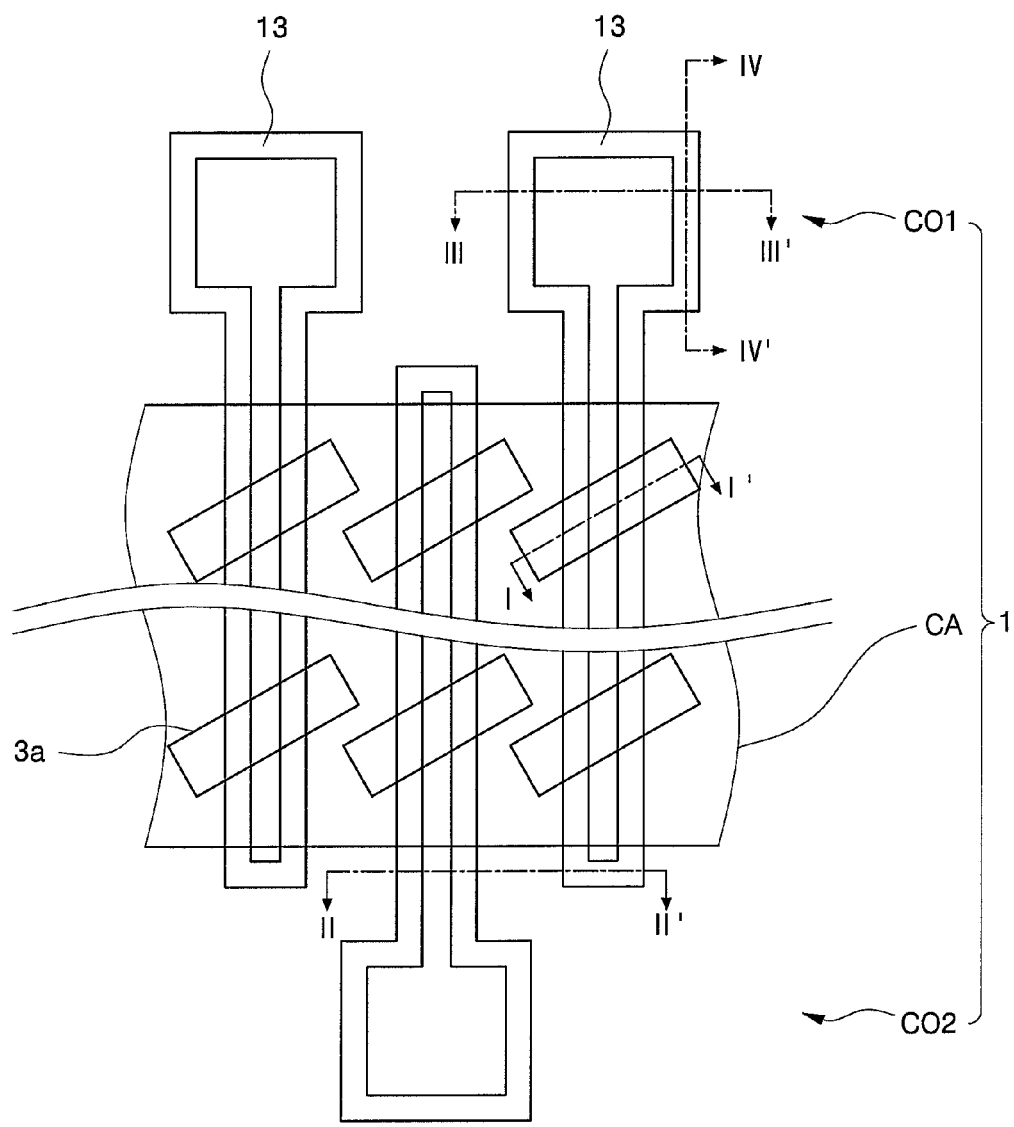

A hard mask 11 having sacrificial openings 11a may be formed on the sacrificial insulating layer 9 (S100). The sacrificial openings 11a may extend to the first and second core regions CO1 and CO2 across the cell array region CA as illustrated in FIG. 13A. Furthermore, each of the sacrificial openings 11a runs across selected one of the active cell regions 3a in the cell array region CA. That is, when seen in a plan view, one sacrificial opening may be formed on one active cell region. Also, a portion of each of the sacrificial openings 11a formed in the first core region CO1 may be different in size from a portion of each of the sacrificial openings 11a formed in the second core region CO2. In other words, as illustrated in FIG. 13A, each of the sacrificial openings 11a may occupy a larger space in one of the first and second core regions CO1 and CO2. In particular, each of the sacrificial openings 11a may have a box shape in one of the first and second core regions CO1 and CO2, as illustrated in FIG. 13A.

Referring to FIGS. 1, 11, 12B, and 13B, sacrificial spacers 13 may be formed on sidewalls of the sacrificial openings 11a (S110). The sacrificial spacers 13 may be formed of a material having an etch selectivity with respect to the hard mask 11. For example, when the hard mask 11 is formed of a silicon nitride layer, the sacrificial spacers 13 may be formed of a silicon oxide layer.

Referring to FIGS. 1, 11, 12C, and 13C, a node separation process may be performed. To this end, the sacrificial spacers 13 may be partially etched to define a region where the conductive lines 22 shown in FIG. 1 will be disposed. Specifically, a node separation mask 15 including node separation openings 15a may be formed on the semiconductor substrate 1 including the sacrificial spacers 13. The node separation mask 15 may be formed of a photoresist layer. Furthermore, the node separation openings 15a may overlap both end portions of the sacrificial openings 11a. As a result, portions of the sacrificial spacers 13 located at both end portions of the sacrificial openings 11a may be exposed by the node separation openings 15a. Subsequently, the exposed portions of the sacrificial spacers 13 may be etched using the node separation mask 15 as an etch mask, thereby forming sacrificial spacer patterns 13a (S120). The sacrificial spacer patterns 13a may be formed in the region where the conductive lines 22 of the semiconductor device described in an exemplary embodiment will be disposed.

Figure 13C:
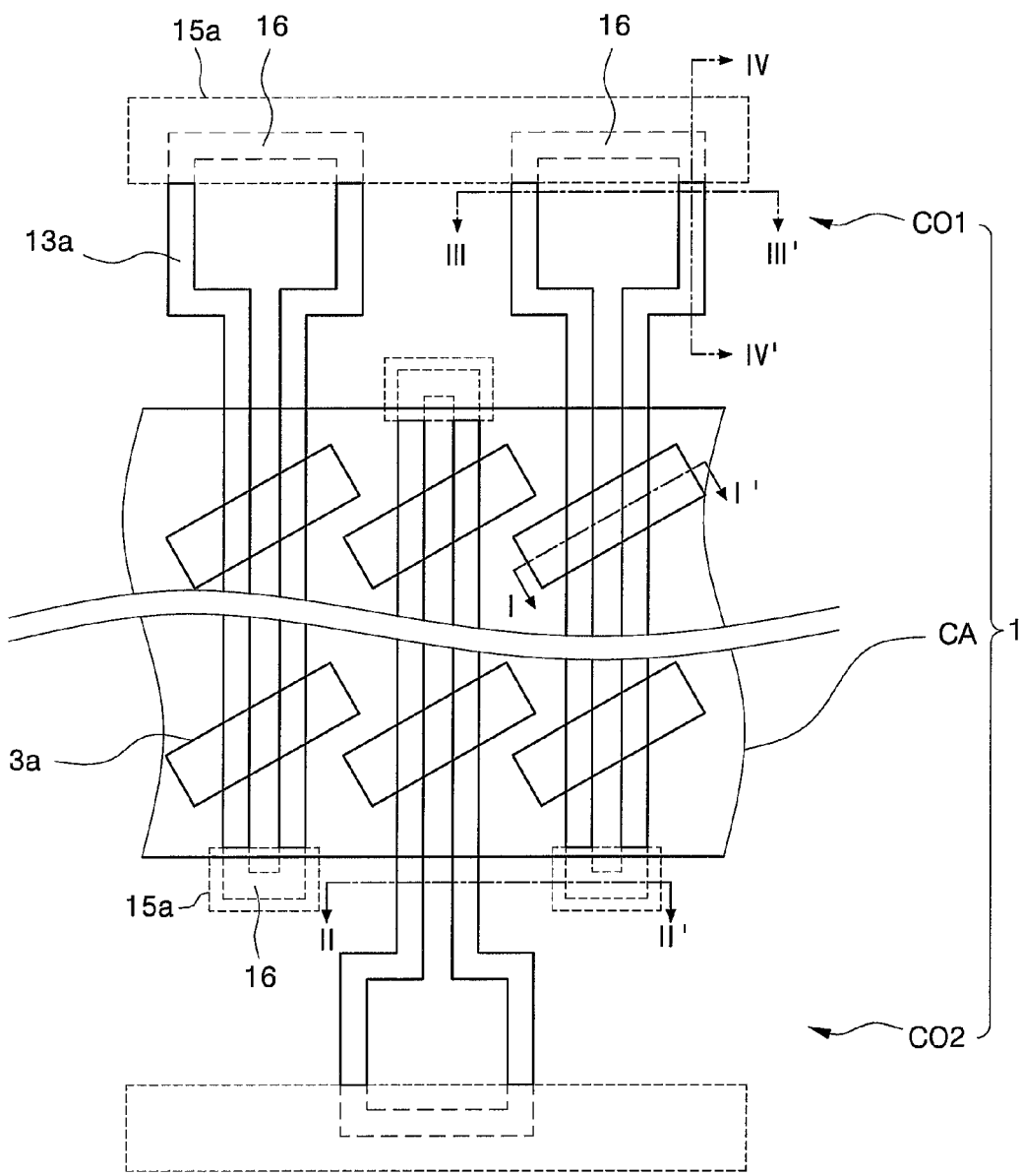
Figure 13D:
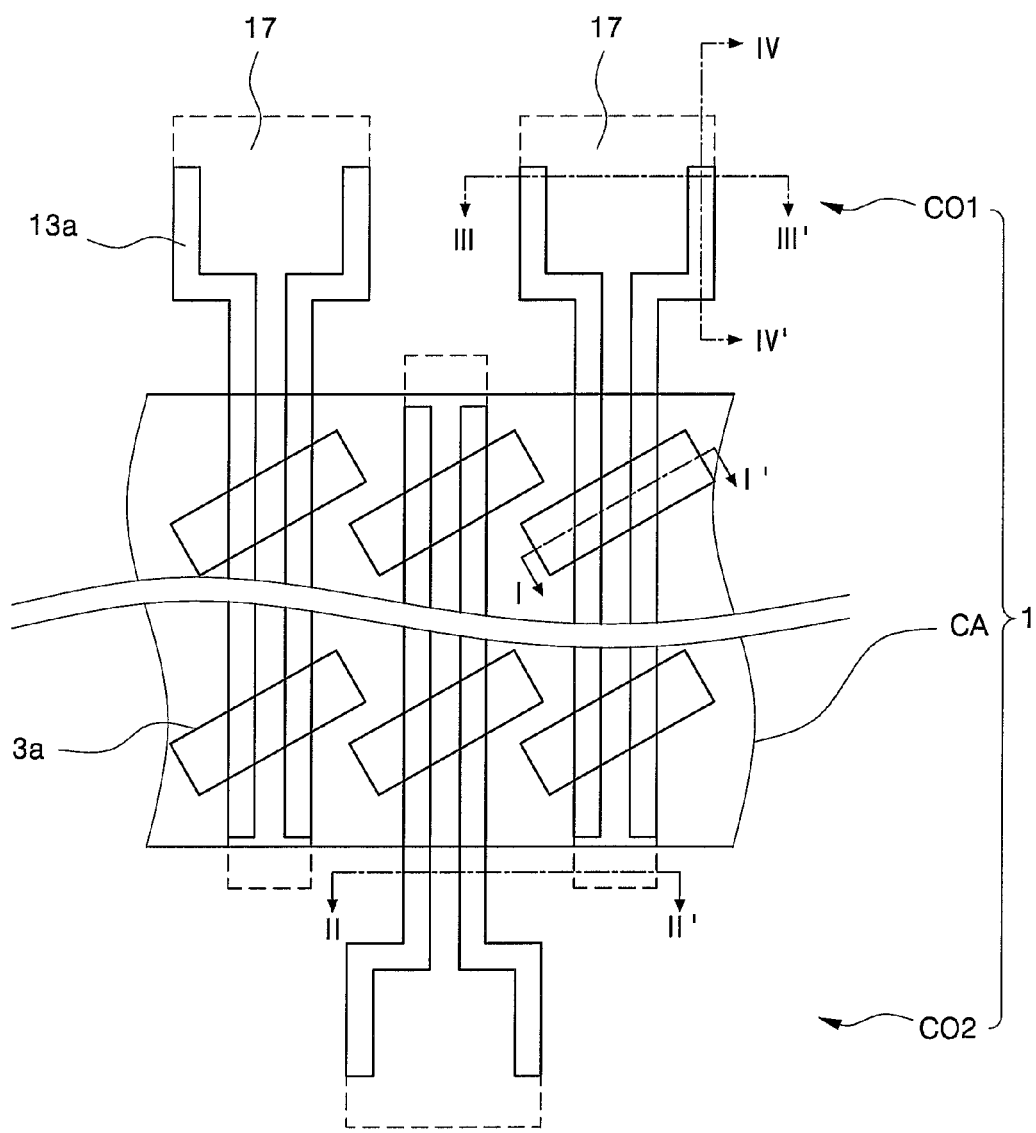
Figure 13E:
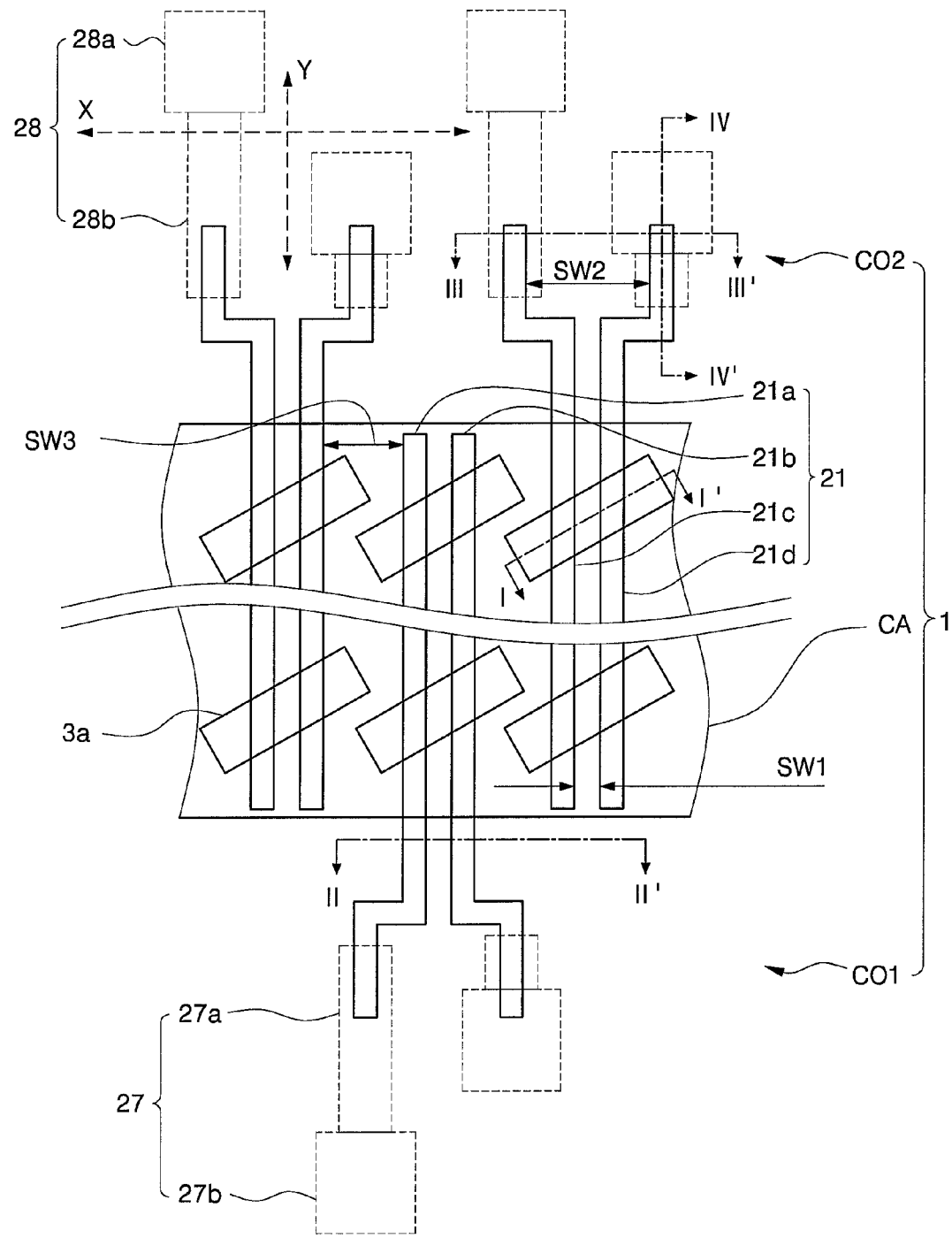

The sacrificial spacer patterns 13a may extend to the first core region CO1 or the second core region CO2 across the cell array region CA. Specifically, as illustrated in FIG. 13C, a pair of sacrificial spacer patterns 13a may be formed on a single active cell region 3a. Furthermore, in FIGS. 12C and 13C, reference numeral 16 refers to regions exposed by the node separation openings 15a from which the sacrificial spacers 13 are etched.

Referring to FIGS. 1, 11, 12D, and 13D, the node separation mask 15 may be selectively removed. Mask patterns 17 may be formed to fill the sacrificial openings 11a of which sidewalls are covered by the sacrificial spacer patterns 13a (S130). The mask patterns 17 may be formed of a material having an etch selectivity with respect to the sacrificial spacer patterns 13a. For example, when the sacrificial spacer patterns 13a may be formed of a silicon oxide layer, the mask patterns 17 may be formed of a silicon nitride layer.

The formation of the mask patterns 17 may include forming a material layer on the semiconductor substrate 1 having the sacrificial spacer patterns 13a and planarizing the material layer using a chemical mechanical polishing (CMP) process until the sacrificial spacer patterns 13a are exposed. In this case, the CMP process may be carried out until the sacrificial spacer patterns 13a are exposed and form planar top surfaces.

Figure 12A:
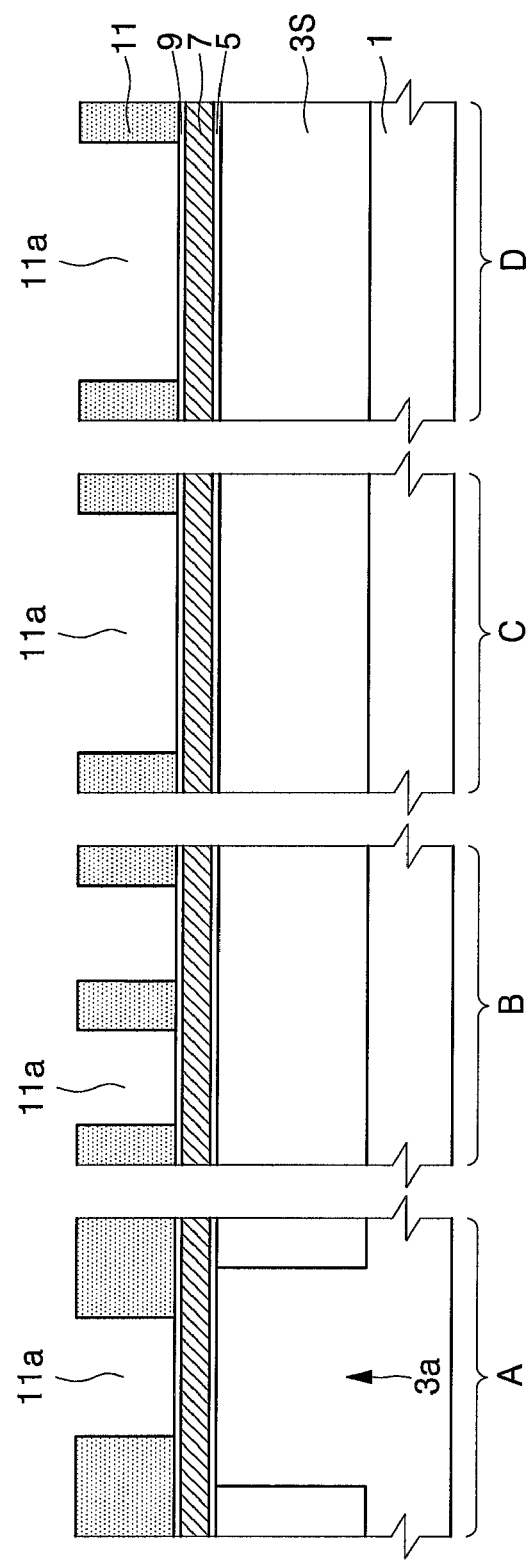
Figure 12C:
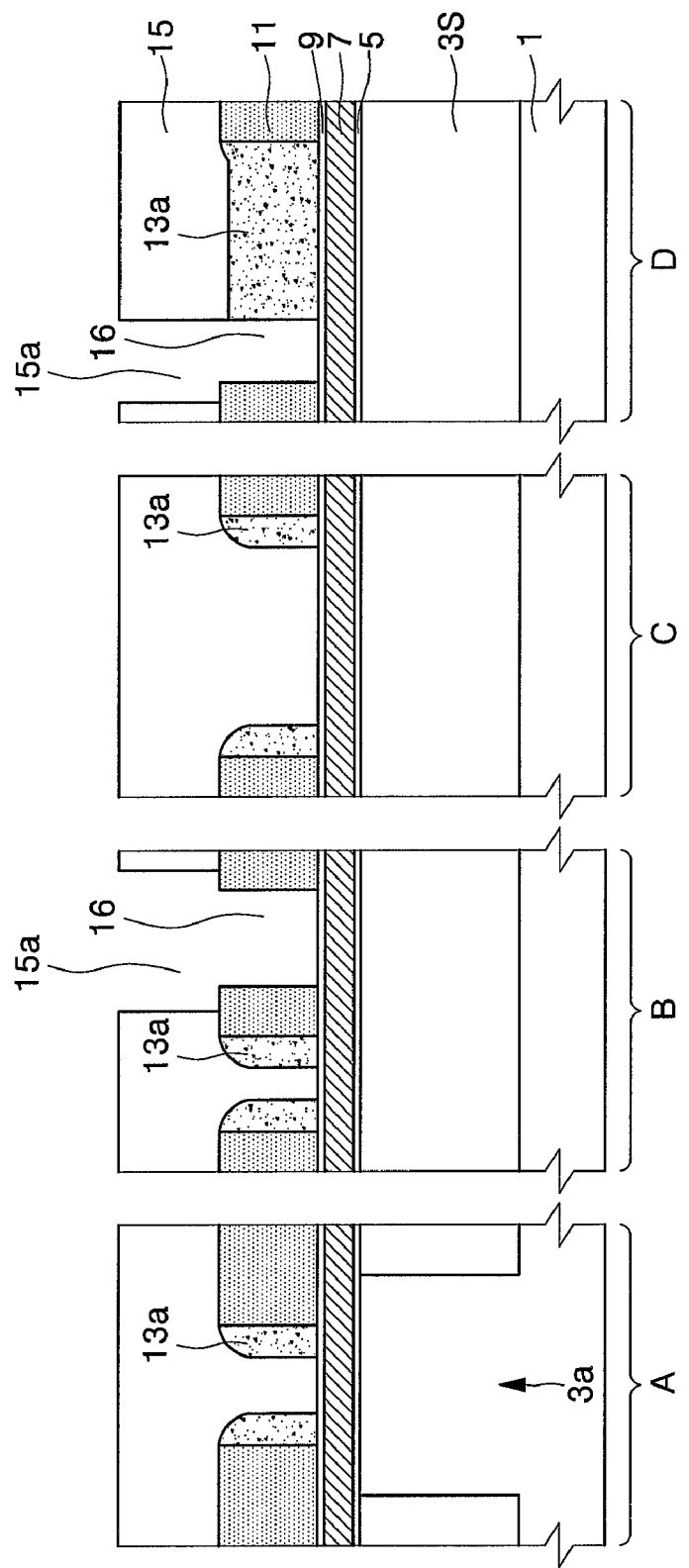
Figure 12D:
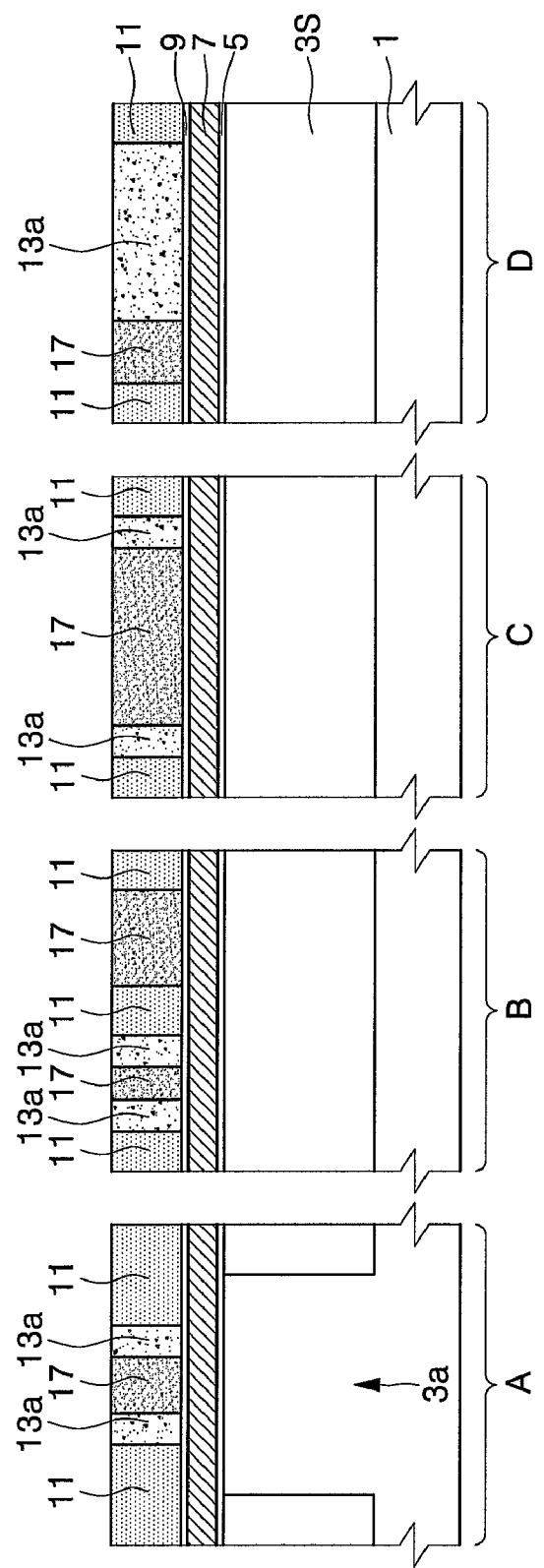
Figure 12E:
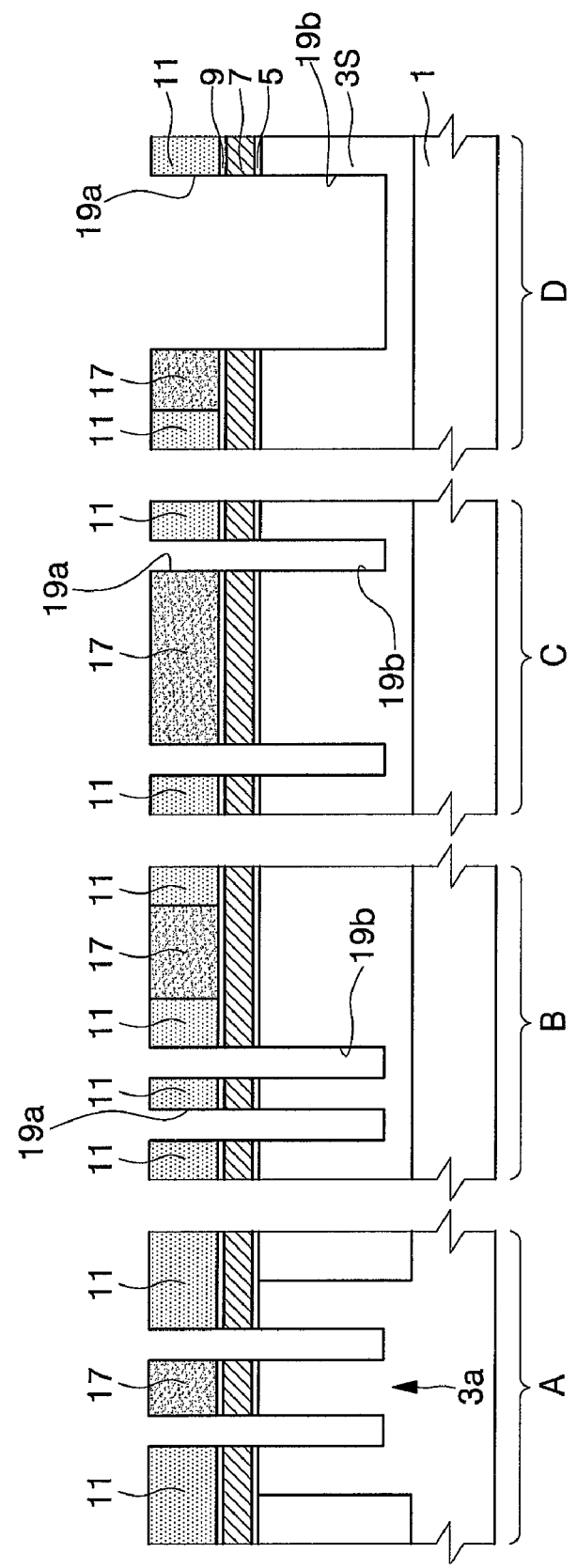
Figure 12F:
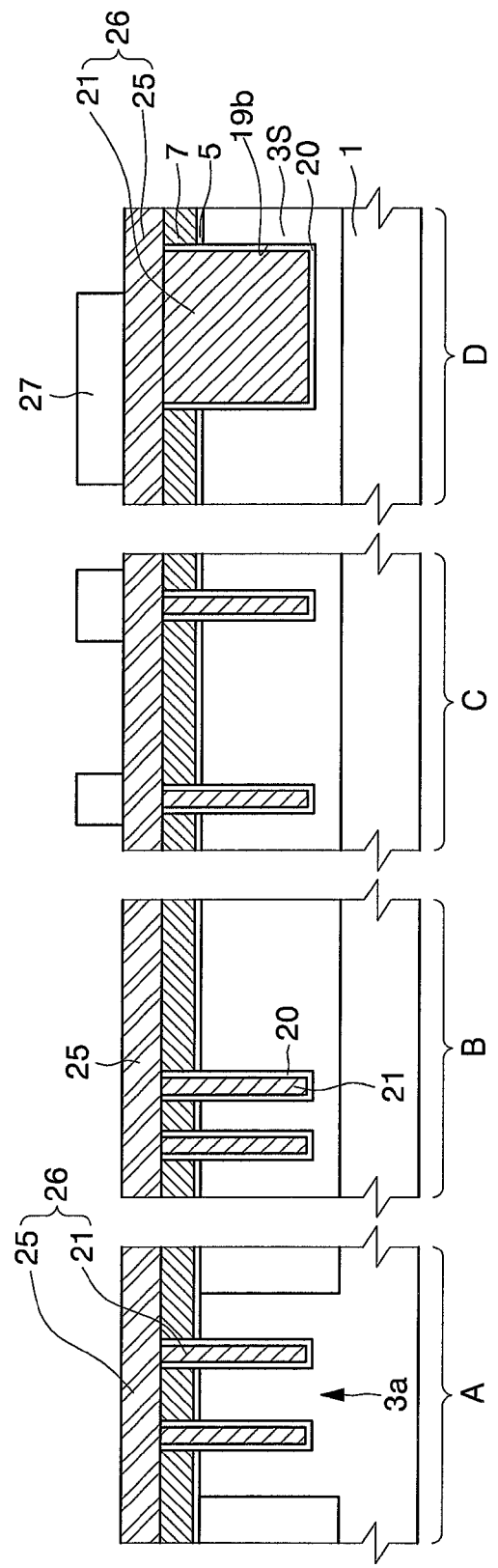

Referring to FIGS. 1, 11, and 12E, the sacrificial spacer patterns 13a may be removed to form trenches 19. Thereafter, the sacrificial insulating layer 9, the buffer conductive layer 7, and the buffer dielectric layer 5 may be sequentially etched using the hard mask 11 and the mask patterns 17 as etch masks, thereby exposing the active cell regions 3a and the isolation layer 3S. Subsequently, the exposed active cell regions 3a and isolation layer 3S may be partially etched using the hard mask 11 and the mask patterns 17 as etch masks. As a result, gate trenches 19b, which extend to the first core region CO1 and the second core region CO2 across the cell array region CA, may be formed (S140). When seen in a plan view, the gate trenches 19b may be formed in regions from which the sacrificial spacer patterns 13a are removed.

Referring to FIGS. 1, 11, 12F, and 13E, the hard mask 11 and the mask patterns 17 may be removed. However, in alternative exemplary embodiments, the process of removing the hard mask 11 and the mask patterns 17 may be omitted.

A conductive layer 26 may be formed on the semiconductor substrate 1 having the gate trenches 19b (S150). Specifically, a conductive material layer may be formed on the substrate 1 having the gate trenches 19b and then planarized to leave preliminary conductive lines 21 in the gate trenches 19b. The preliminary conductive lines 21 may include first through fourth preliminary conductive lines 21a, 21b, 21c, and 21d which are arranged in sequence in the cell array region CA. Furthermore, the first and second preliminary conductive lines 21a and 21b may extend from the cell array region CA to the first core region CO1, and the third and fourth preliminary conductive lines 21c and 21d may extend from the cell array region CA to the second core region CO2.

A pad conductive layer 25 may be formed on the semiconductor substrate 1 having the preliminary conductive lines 21. Thus, the conductive layer 26 may include the preliminary conductive lines 21 and the pad conductive layer 25. The preliminary conductive lines 21 may be formed of a metal layer, such as a titanium nitride layer. The pad conductive layer 25 may be formed of a metal layer, such as a tungsten layer or a tungsten silicide layer. Furthermore, before the preliminary conductive lines 21 are formed, the semiconductor substrate 1 including the gate trenches 19b may be thermally oxidized to form a gate dielectric layer 20. Alternatively, the gate dielectric layer 20 may be formed of a high-k dielectric material using an atomic layer deposition (ALD) process.

First contact pad masks 27 and second contact pad masks 28 may be formed on the pad conductive layer 25 (S160). The first and second contact pad masks 27 and 28 may overlap end portions of the preliminary conductive lines 23 that fill the gate trenches 19b. Specifically, the first contact pad masks 27 may overlap end portions of the first and second preliminary conductive lines 21a and 21b in the first core region CO1, and the second contact pad masks 28 may overlap end portions of the third and fourth preliminary conductive lines 21c and 21d in the second core region CO2. Each of the first contact pad masks 27 may include a first contact pad region 27a and a first connection region 27b. The first connection region 27b may overlap the end portions of the first and second preliminary conductive lines 21a and 21b in the first core region CO1. Each of the second contact pad masks 28 may include a second contact pad region 28a and a second connection region 28b. The second contact region 28b may overlap the end portions of the third and fourth preliminary conductive lines 21c and 21d in the second core region CO2. Here, the first and second contact pad regions 27a and 28a may define regions where the contact pads 25p and 25q described in a previously discussed exemplary embodiment will be formed.

Referring to FIGS. 1, 11, and 12G, the pad conductive layer 25 may be etched using the first and second contact pad masks 27 and 28 as etch masks, thereby forming first and second contact pads 25p and 25q and first and second connection portions 25a and 25b. Subsequently, the preliminary conductive lines 21 may be partially etched using the first and second contact pad masks 27 and 28 as etch masks, thereby leaving conductive lines 22 in the gate trenches 19b (S170). The conductive lines 22 may be formed at a lower level than the top surfaces of the active regions 3a and the isolation layer 3S. While the preliminary conductive lines 21 are being partially etched, the preliminary conductive lines 23 formed in regions where the first and second contact pad masks 27 and 28 overlap the preliminary conductive lines 21 are not etched. Therefore, the conductive lines 22 can be electrically connected to the first and second contact pads 25p and 25q.

Although not shown in the drawings, while the first and second contact pad masks 27 and 28 are being formed, peripheral gate masks may also be formed in the first and second core regions CO1 and CO2, or peripheral regions. Thus, during the etching of the pad conductive layer 25, the pad conductive layer 25, the buffer conductive layer 7, and the buffer dielectric layer 5 located under the peripheral gate masks may be left to form peripheral gate patterns.

Insulating patterns 29a may be formed on the conductive lines 22. The insulating patterns 29a may be formed at substantially the same level as the active cell regions 3a and the isolation layer 3S. While the insulating patterns 29a are being formed, pad spacers 29b may also be formed to cover sidewalls of the contact pads 25p and 25q. Furthermore, source and drain regions 31 may be formed in the active cell regions 3a on both sides of the conductive lines 22. Thus, in the cell array region CA, conductive lines (i.e., buried gate lines) 22 may be formed to a line width smaller than the resolution limit in a lithography process. As a result, cell transistors including the buried gate lines 22 and the source and drain regions 31 may be completed.

Figure 14:
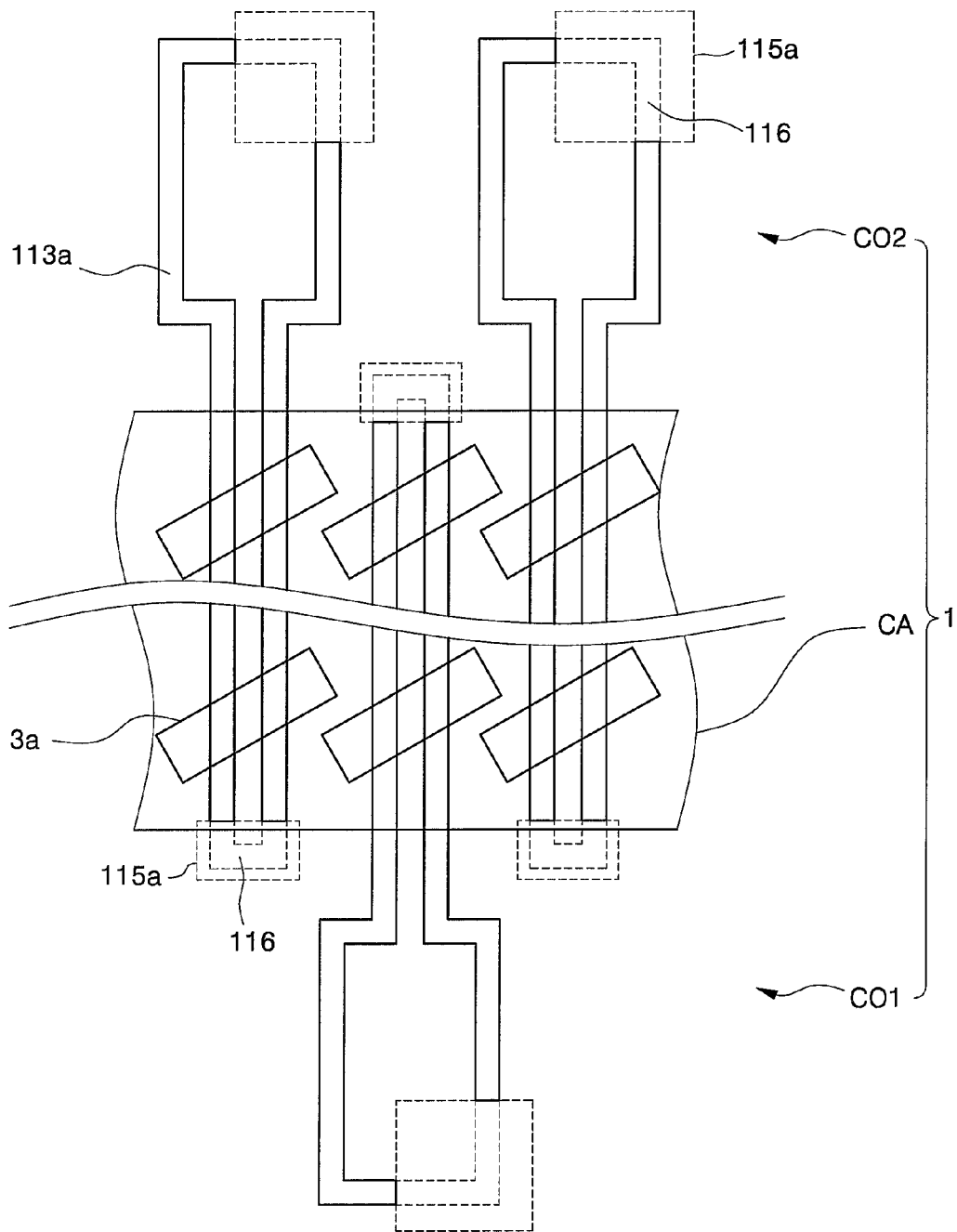
FIG. 14 is a cross-sectional view illustrating the method of fabricating the semiconductor device according to an exemplary disclosed embodiment.

A method of fabricating the semiconductor device according to an alternative exemplary embodiment will now be described with reference to FIGS. 2, 11, and 14. The method according to an alternative exemplary embodiment is different than the one previously discussed in terms of step S120 in which first and second sacrificial spacers are formed to cover sidewalls of the sacrificial openings using the node separation process described in FIG. 11. Specifically, in the previous exemplary embodiment, a node separation process is carried out to form the sacrificial spacer patterns 13a as illustrated in FIG. 13C. In comparison, in the present exemplary embodiment, a node separation process is carried out to form the sacrificial spacer patterns 113a as illustrated in FIG. 14. The sacrificial spacer patterns 113a may define regions where conductive lines will be formed later. Thus, the conductive lines may be determined by arrangement of the sacrificial spacer patterns 113a.

As a result, as illustrated in FIG. 14, a node separation process including etching a predetermined portion of a sacrificial spacer may be performed using a node separation mask having a node separation opening 115a to form the sacrificial spacer patterns 113a. In an exemplary embodiment, reference numeral 116 refers to a region exposed by the node separation opening 115a from which the sacrificial spacer is removed. For reference, because the arrangement of the sacrificial spacer patterns 113a is the same as that of the conductive lines 122 as described in an exemplary disclosed embodiment, a detailed description thereof will be omitted here.

Figure 15A:
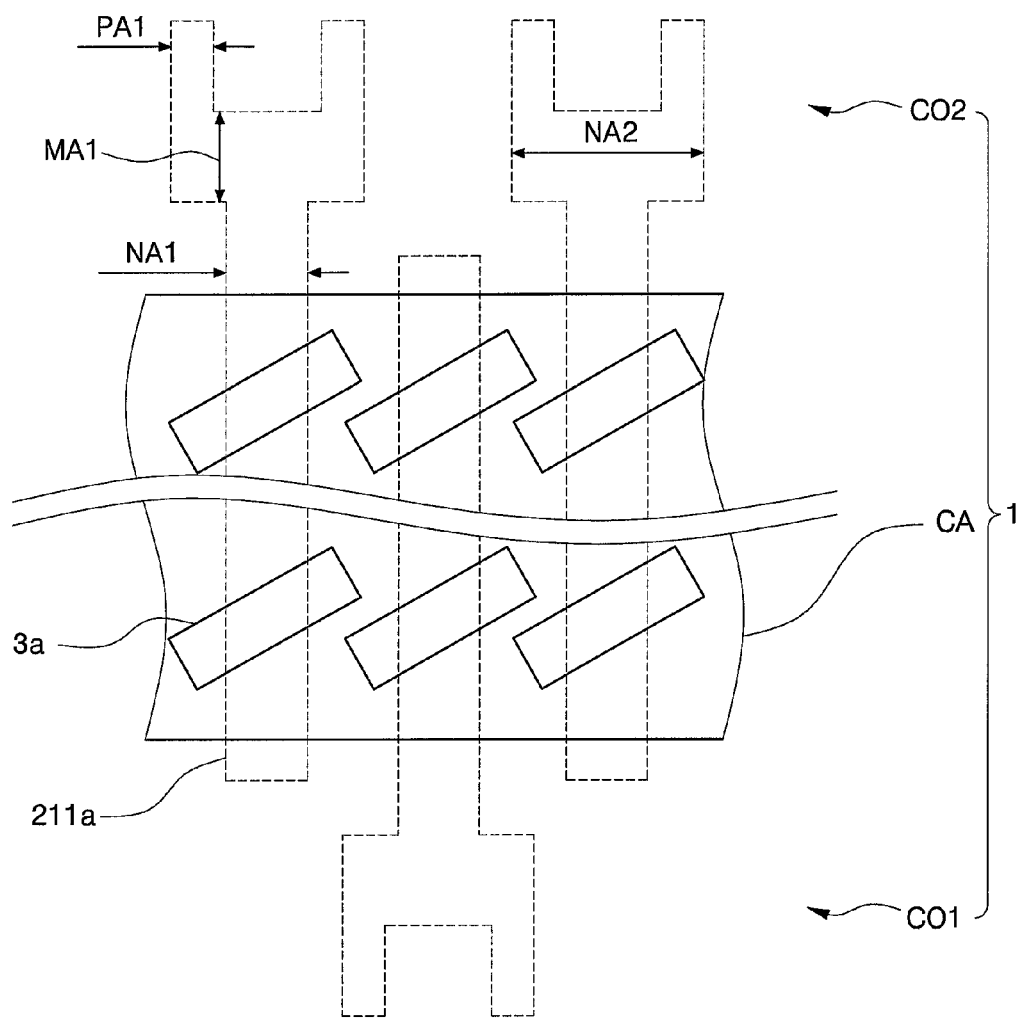
FIGS. 15A and 15B are cross-sectional views illustrating a method of fabricating a semiconductor device according to an alternative exemplary disclosed embodiment.
Figure 15B:
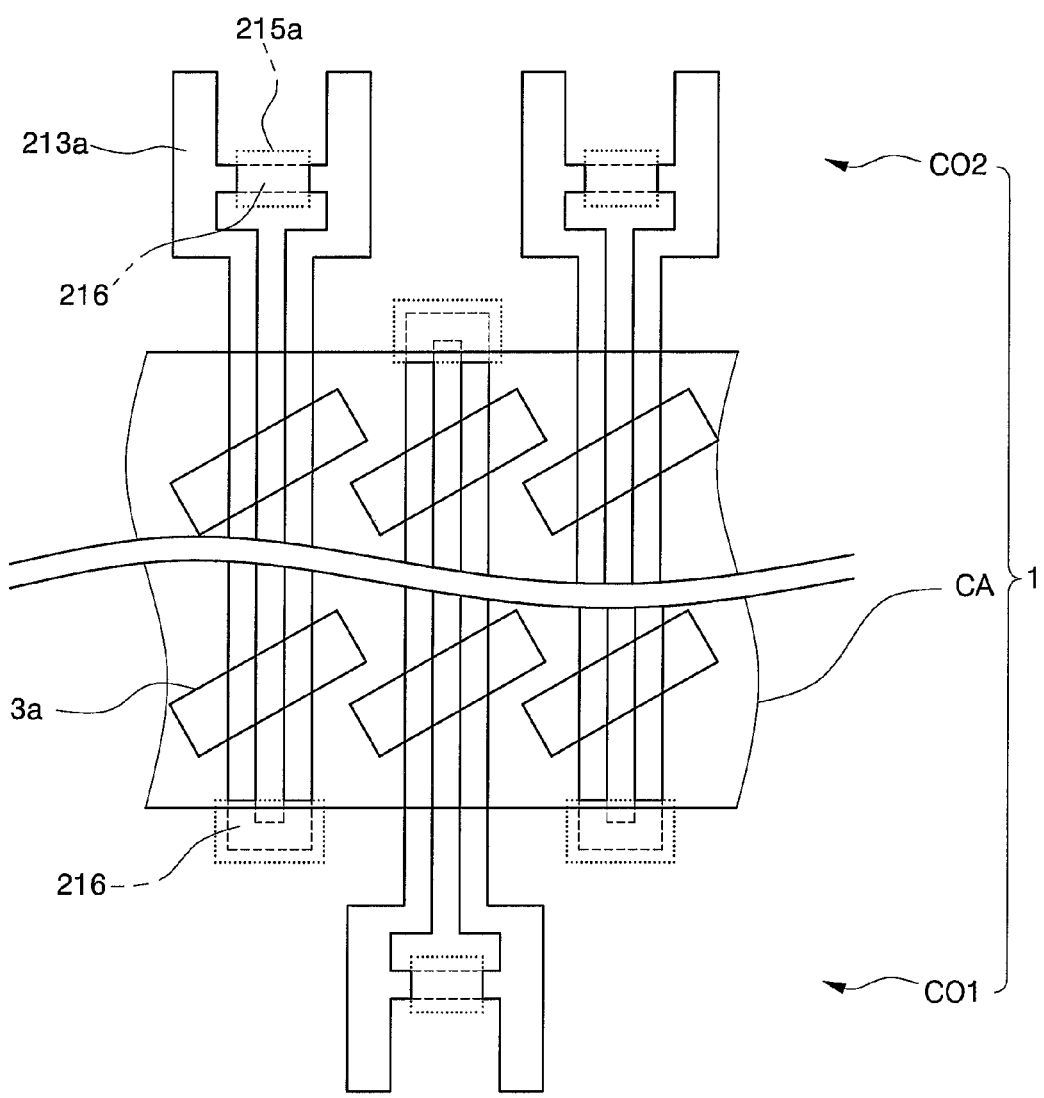

A method of fabricating the semiconductor device according to an alternative exemplary embodiment will now be described with reference to FIGS. 3, 11, 15A, and 15B. The method according to the presently discussed exemplary embodiment is different from the method according to the previously discussed exemplary embodiment with respect to FIGS. 1, 12A through 12G, and 13A through 13E in terms of the shape of a sacrificial opening in step S100 and the shape of first and second sacrificial spacer patterns in step S120 as described in FIG. 11. More specifically, in the presently discussed exemplary embodiment, a hard mask having sacrificial openings 211a shown in FIG. 15A is formed (S100). Each of the sacrificial openings 211a extends to the first and second core regions CO1 and CO2 across the cell array region CA. Furthermore, each of the sacrificial openings 211a has a first width NA1 in the cell array region CA. In one of the first and second core regions CO1 and CO2, each of the sacrificial openings 211a extends by a first length MA1 and has a second width NA2 greater than the first width NA1, and further extends to a third width PA1 smaller than the first width NA1 from both sides of the end portion that extends by the first length MA1. Furthermore, in the presently discussed exemplary embodiment, the third width PA1 may be greater than the width of a sacrificial spacer that will be formed later.

Similar to the method described in a previously discussed exemplary embodiment with respect to FIGS. 1, 12A through 12G, and 13A through 13E, sacrificial spacers may be formed to cover sidewalls of the sacrificial openings 211a (S110). Thereafter, a node separation process may be carried out so that sacrificial spacer patterns 213a can be formed to partially cover the sidewalls of the sacrificial openings 211a (S120). The sacrificial spacer patterns 213a may define regions where conductive lines will be formed later. Thus, the conductive lines may be determined by arrangement of the sacrificial spacer patterns 213a. As a result, a node separation process including etching a predetermined portion of a sacrificial spacer may be performed using a node separation mask having a node separation opening 215a shown in FIG. 15B, so that the sacrificial spacer patterns 213a can be formed. Here, reference numeral 216 refers to a region exposed by the node separation opening 215a from which the sacrificial spacer is removed. For reference, because the arrangement of the sacrificial spacer patterns 113a is the same as that of the conductive lines 222 as described in a previously discussed embodiment with respect to FIG. 3, a detailed description thereof will be omitted here.

In an alternative exemplary embodiment, a semiconductor memory device may be fabricated by modifying the shape of a contact pad mask during the process of fabricating the semiconductor device according to a previously discussed exemplary embodiment with respect to FIG. 3 using the method of fabricating the semiconductor device according to a previously discussed exemplary embodiment with respect to FIGS. 12A-12G and 13A-13G. More specifically, in order to fabricate the semiconductor device according to the presently discussed embodiment, a contact pad mask having only a contact region is employed instead of a contact pad mask having a connection region and a contact region. All subsequent processes are carried out as described in the previously discussed exemplary embodiment with respect to FIG. 11, FIGS. 12A-12G, and FIGS. 13A-13G.

Figure 16:
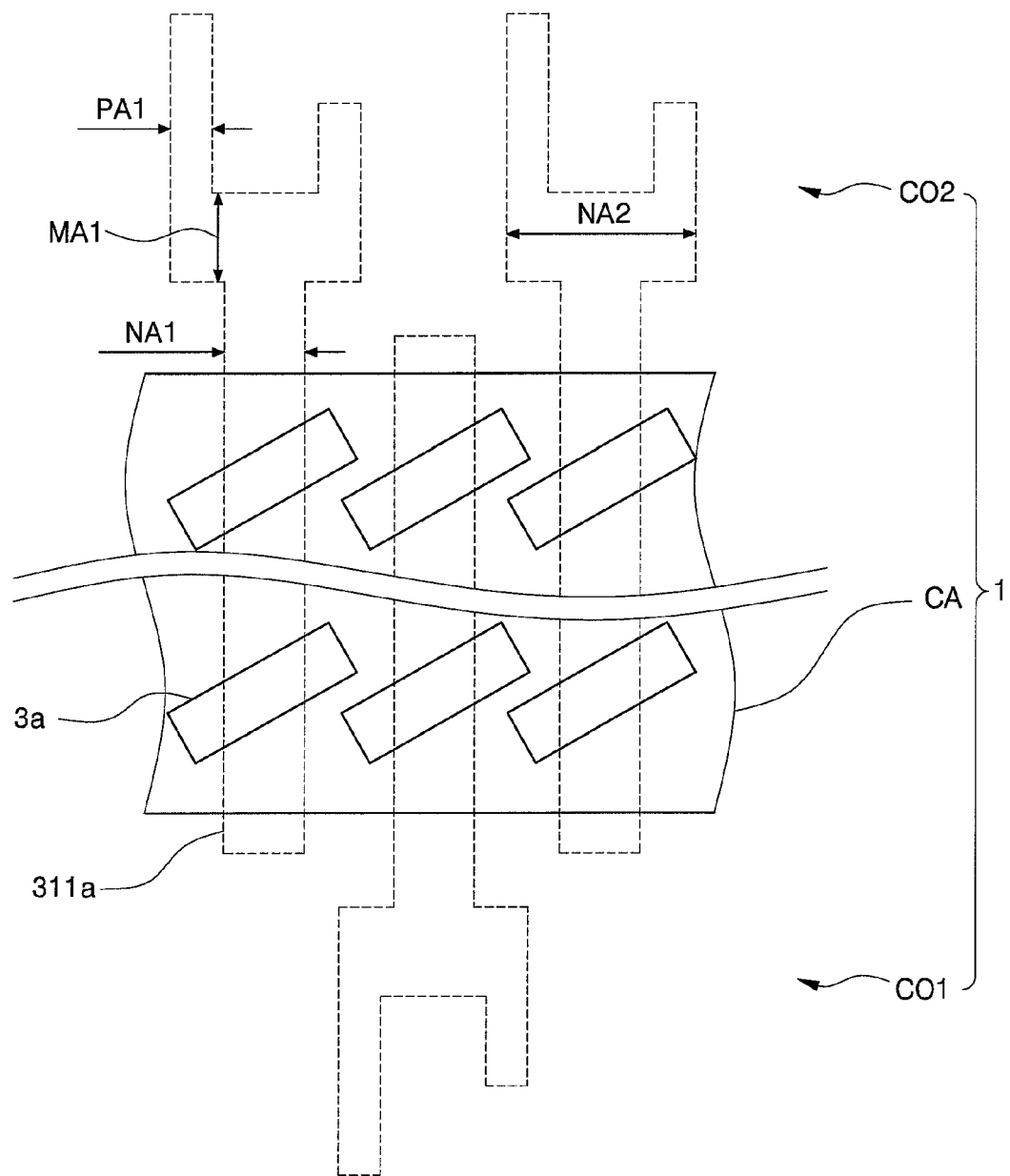
FIG. 16 is a cross-sectional view illustrating a method of fabricating a semiconductor device according to yet another alternative exemplary disclosed embodiment.

A method of fabricating the semiconductor device according to yet another alternative exemplary embodiment will now be described with reference to FIGS. 4, 11, and 16. The method according to the presently discussed exemplary embodiment is different from the previously discussed exemplary embodiment with respect to FIGS. 15A and 15B in terms of the shape of a sacrificial opening in step S100 and the shape of first and second sacrificial spacer patterns in step S120 as described in FIG. 11. Specifically, each of sacrificial openings 311a as illustrated in FIG. 16 has a first width NA1 in the cell array region CA. Also, in one of the first and second core regions CO1 and CO2, each of the sacrificial openings 311a extends by a first length MA and has a second width NA2 greater than the first width NA1, and further extends from both sides of the end portion, which extends by the first length MA1, to form two divided portions with different lengths and a third width PA1 smaller than the first width NA1. Thus, because only the shape of the sacrificial openings in the presently discussed embodiment with respect to FIG. 16 is different than that of the previously discussed exemplary embodiment with respect to FIGS. 15A and 15B, the method of fabricating the semiconductor device disclosed in FIG. 16 is very similar to the method disclosed in the exemplary embodiment discussed with respect to FIGS. 15A and 15B.

Figure 17:
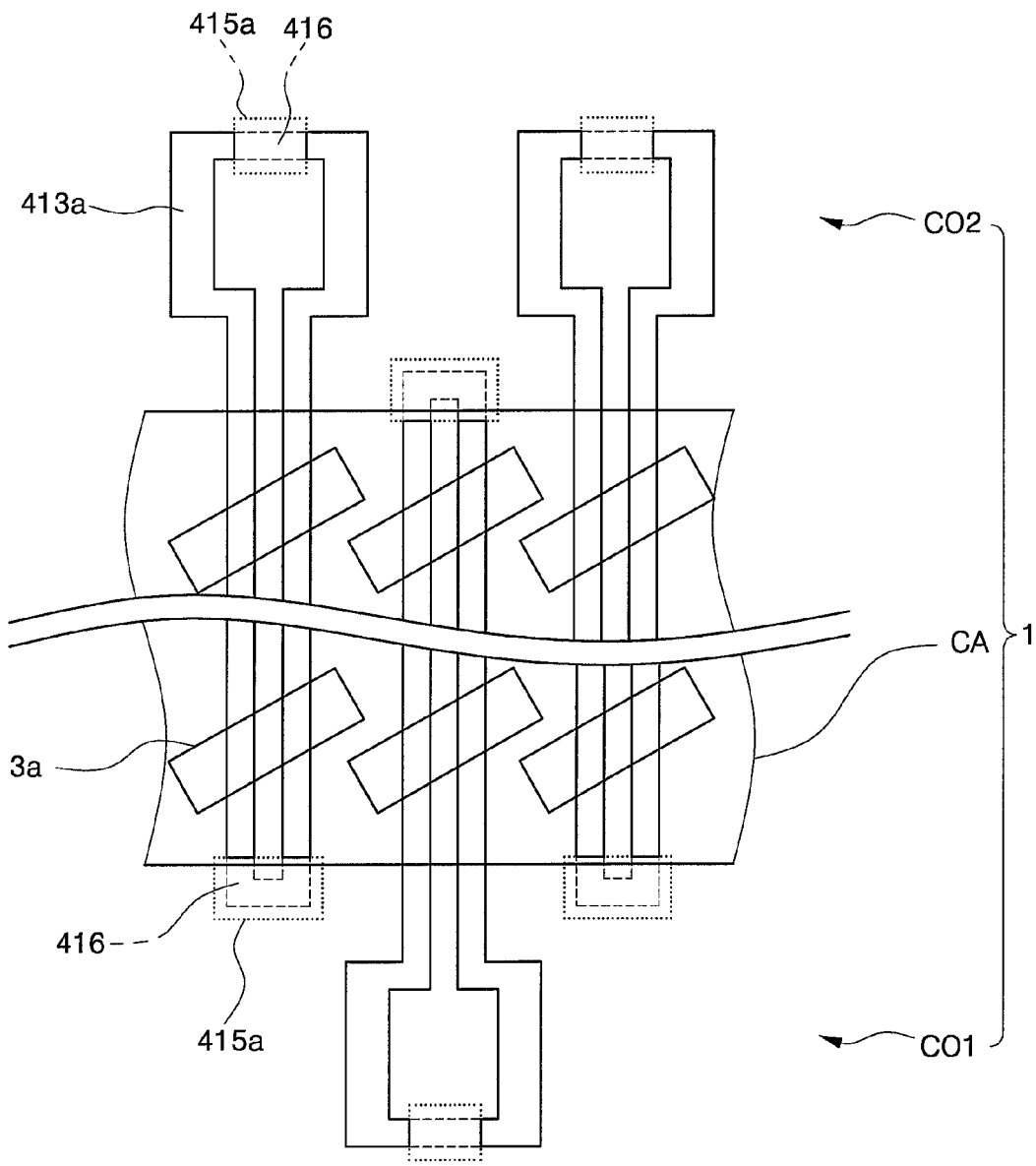
FIG. 17 is a cross-sectional view illustrating a method of fabricating a semiconductor device according to yet another alternative exemplary disclosed embodiment.

A method of fabricating the semiconductor device according to yet another exemplary embodiment will now be described with reference to FIGS. 5, 11, and 17. The method according to the presently discussed exemplary embodiment differs from the method described in a previously discussed exemplary embodiment with respect to FIGS. 11, 12A-12G, and 13A-13E. Specifically a node separation process in step S120 and the shape of a contact pad mask in step S160 as described in FIG. 11 are different in the presently discussed exemplary embodiment.

Therefore, in order to fabricate the semiconductor device according to the presently discussed embodiment, the same processes as those of the previously discussed exemplary embodiment with respect to FIGS. 11, 12A-12G, and 13A-13E are performed up until forming a sacrificial spacer (S110). Then, node separation openings 415a of a node separation mask used in the node separation process in step S120 described in FIG. 11 are formed as illustrated in FIG. 17. Both end portions of the sacrificial spacer are selectively removed using the node separation mask having the node separation openings 415a that selectively expose the both end portions of the sacrificial spacer, so that sacrificial spacer patterns 413a can be obtained. Here, reference numeral 416 refers to a region from which the sacrificial spacer is partially etched.

Thereafter, subsequent processes may be performed up until forming a conductive layer on a substrate having trenches (S150 of FIG. 11) as described in the exemplary method with respect to FIGS. 11, 12A-12G, and 13A-13E. Furthermore, a contact pad mask may be formed on the conductive layer such that the contact pad mask overlaps end portions of the trenches located in a first core region CO1 or a second core region CO2. Subsequent processes may be performed like in the previously discussed exemplary embodiment with respect to FIGS. 11, 12A-12G, and 13A-13E. As a result, the semiconductor device according to a previously discussed embodiment with respect to FIG. 5 may be fabricated by using the method according to the presently discussed embodiment.

A method of fabricating the semiconductor device according to yet another exemplary embodiment will now be described with reference to FIGS. 7, 11, 18A, and 18B. The method according to the presently discussed exemplary embodiment is different from the method according to the previously discussed exemplary embodiment with respect to FIGS. 11, 12A-12G, and 13A-13E. Specifically, the difference lies with respect to the sacrificial opening in a process of forming a hard mask having the sacrificial opening (S100 of FIG. 11) and the shape of sacrificial spacer patterns in a process of forming the sacrificial spacer patterns (S120 of FIG. 11). Therefore, the presently discussed method is substantially similar to the method according to the previously discussed exemplary embodiment with respect to FIGS. 11, 12A-12G, and 13A-13E.

Figure 18A:
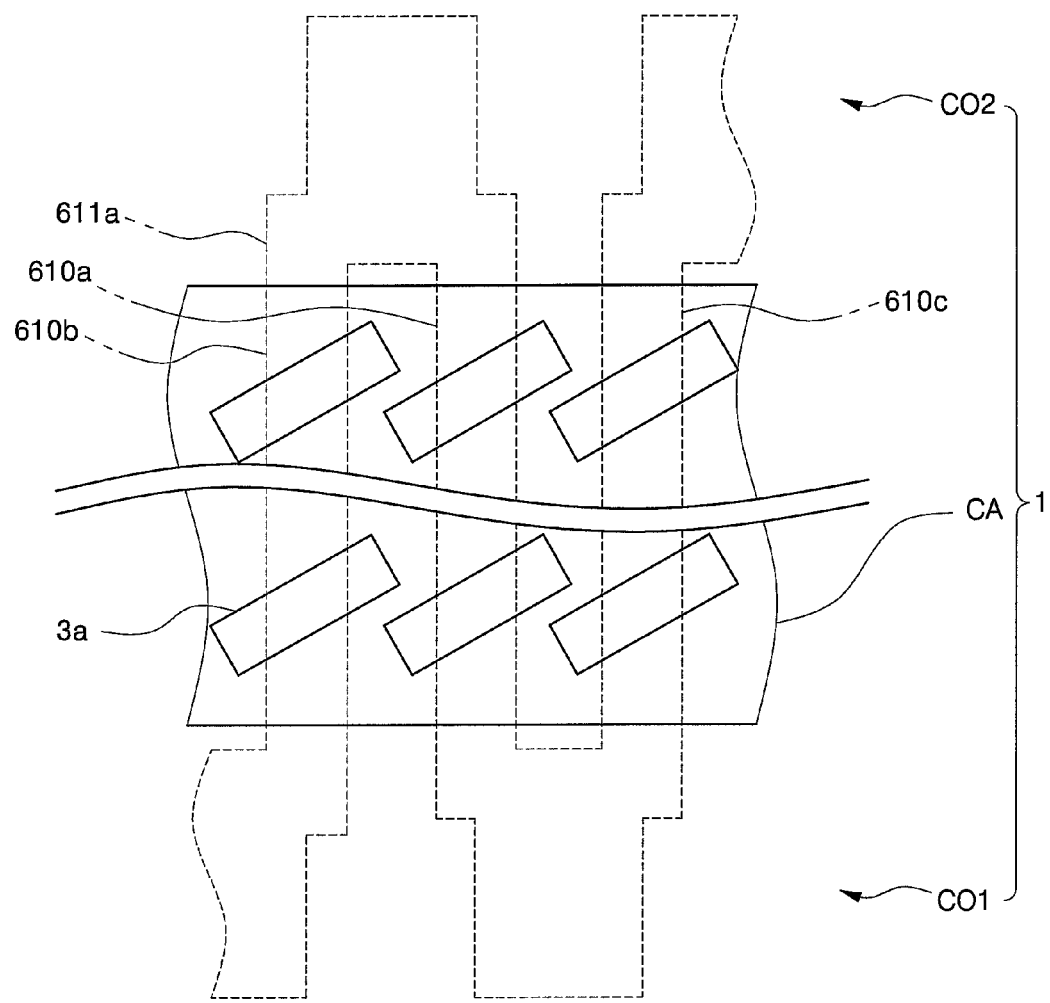
FIGS. 18A and 18B are cross-sectional views illustrating a method of fabricating a semiconductor device according to yet another alternative exemplary disclosed embodiment.

More specifically, FIG. 18A illustrates a sacrificial opening 611a that is made in a hard mask in step S100 as described in FIG. 11. That is, FIG. 13A illustrates a plurality of sacrificial openings 11a, whereas FIG. 18A illustrates a single sacrificial opening 611a. In other words, the shape of sacrificial openings used in the presently discussed exemplary embodiment is the same as the shape of the sacrificial openings used in previously discussed exemplary embodiments in the cell array region CA. However, the shape of the presently discussed sacrificial openings is different from the shape of the sacrificial openings used in the previously discussed exemplary embodiments in the first and second core regions CO1 and CO2.

In particular, in the presently discussed exemplary embodiment, a plurality of sacrificial openings 611a may be formed across the cell array region CA and include first through third cell sacrificial openings 610a, 610b, and 610c that are arranged in sequence in the cell array region CA. The first and second cell sacrificial openings 610a and 610b may extend from the cell array region CA to the first core region CO1 and are combined into one opening in the first core region CO1. Also, the second and third cell sacrificial openings 610b and 610c may extend from the cell array region CA to the second core region CO2 and are combined into one opening in the second core region CO2.

On the other hand, each of the first through third cell sacrificial openings 610a, 610b, and 610c may have one feature size (1F). In an exemplary embodiment, the one feature size (1F) may be defined as the minimum dimension that is feasible within the resolution limit in a lithography process.

Figure 18B:
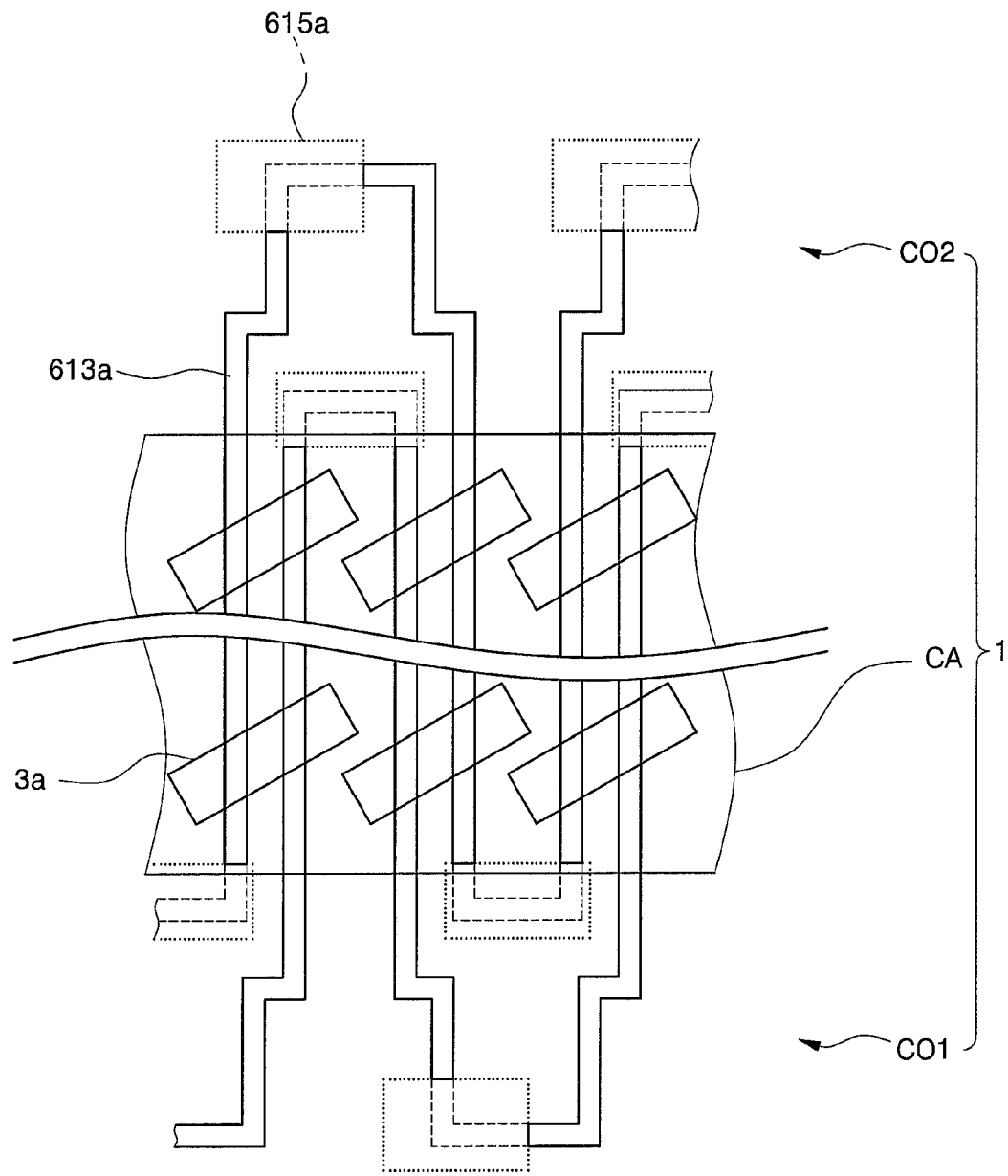

Next, a sacrificial spacer may be formed to cover a sidewall of the sacrificial opening 611a (S110). Subsequently, as illustrated in FIG. 18B, a node separation process may be carried out so that sacrificial spacer patterns can be formed to partially cover the sidewall of the sacrificial opening 611a (S120). The sacrificial spacer may be etched using a node separation mask having a node separation opening 615a. The node separation opening 615a exposes the sacrificial spacer covering the sidewall of the sacrificial opening 611a having the first and second cell sacrificial openings 610a and 610b which extend from the cell array region CA to the first and second core regions CO1 and CO2 and which are combined into one opening. Furthermore, the node separation opening also exposes the sacrificial spacer located at end portions of the first and second core regions CO1 and CO2. As a result, sacrificial spacer patterns 613a can be obtained.

In an exemplary embodiment, the node separation opening 615a may expose the sacrificial spacer located at the end portions of the first and second core regions CO1 and CO2, and the sacrificial spacer located between corners of the end portions of the first and second core regions CO1 and CO2 and the cell array region CA. Thus, the sacrificial spacer patterns 613a may be arranged in the same manner as the conductive lines 622 shown in FIG. 7. Subsequently processes are performed in the same manner and order as described in a previously discussed exemplary embodiment with respect to FIG. 11. As a result, the semiconductor device according to an exemplary embodiment shown in FIG. 7 can be fabricated.

A method of fabricating the semiconductor device according to yet another exemplary embodiment will now be described with reference to FIGS. 8, 11, 19A, and 19B. The method according to present discussed exemplary embodiment differs from the method according to previously discussed exemplary embodiment with respect to FIGS. 11, 12A-12G, and 13A-13E. In particular, the method differs in terms of the shape of a sacrificial opening in a process of forming a hard mask having the sacrificial opening in step S100 of FIG. 11 and the shape of sacrificial spacer patterns in a process of forming the sacrificial spacer patterns in step S120 of FIG. 11.

Figure 19A:
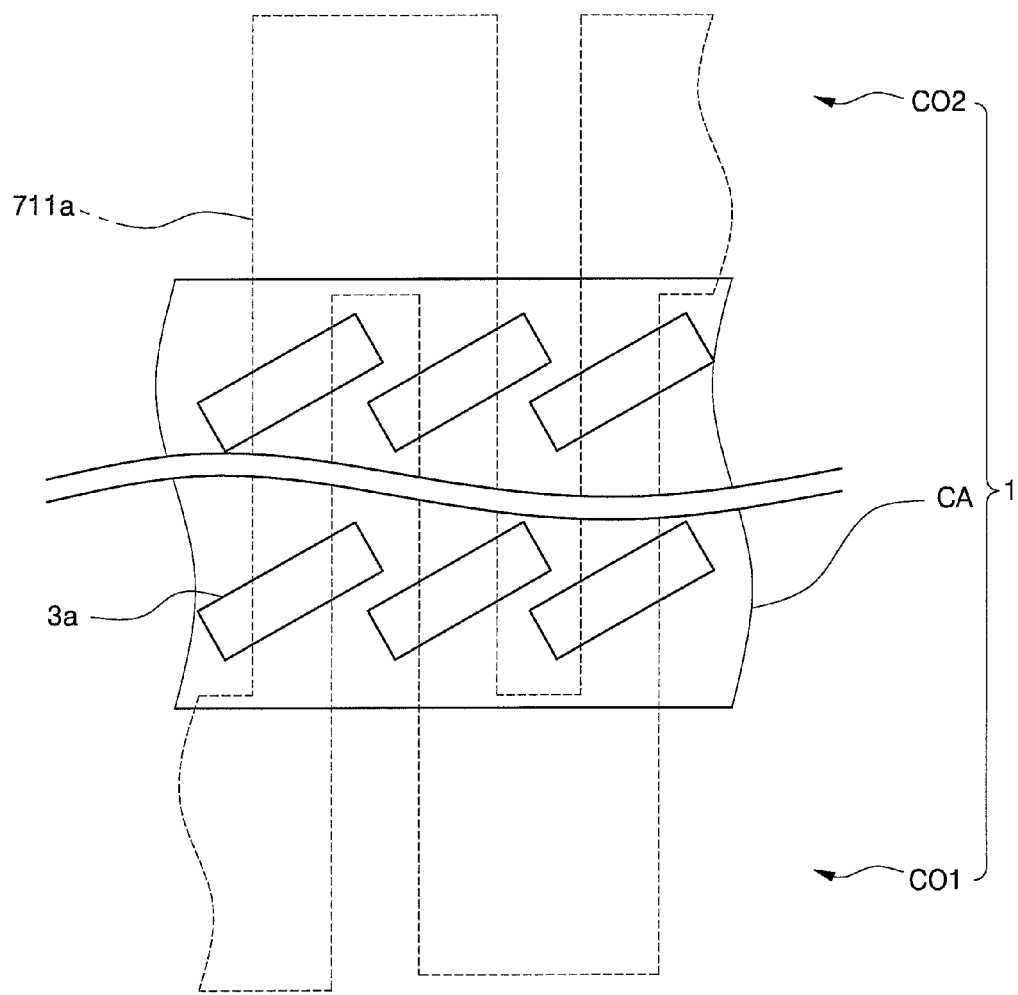
FIGS. 19A and 19B are cross-sectional views illustrating a method of fabricating a semiconductor device according to yet another alternative exemplary disclosed embodiment.

More specifically, FIG. 19A illustrates a sacrificial opening 711a that is made in a hard mask in step S100 as described in FIG. 11. That is, FIG. 13A illustrates a plurality of sacrificial openings 11a, whereas FIG. 19A illustrates a single sacrificial opening 711a. In other words, the shape of sacrificial openings used in the presently discussed exemplary embodiment is the same as the shape of sacrificial openings used in the previously discussed exemplary embodiments in the cell array region CA. However, the shape of the presently discussed sacrificial openings is different from the shape of the sacrificial openings used in the previously discussed exemplary embodiments in the first and second core regions CO1 and CO2.

Specifically, in the presently discussed embodiment, a plurality of sacrificial openings 711a may be formed across the cell array region CA and include first through third cell sacrificial openings that are arranged in sequence in the cell array region CA. The first and second cell sacrificial openings may extend from the cell array region CA to the first core region CO1 and are combined into one opening in the first core region CO1. Also, the second and third cell sacrificial openings may extend from the cell array region CA to the second core region CO2 and are combined into one opening in the second core region CO2. In this case, the width of the sacrificial opening 711a in the first and second core regions CO1 and CO2 may be equal to the sum of the widths of the first and second cell sacrificial openings and a distance between the first and second cell sacrificial openings in the cell array region CA.

Figure 19B:
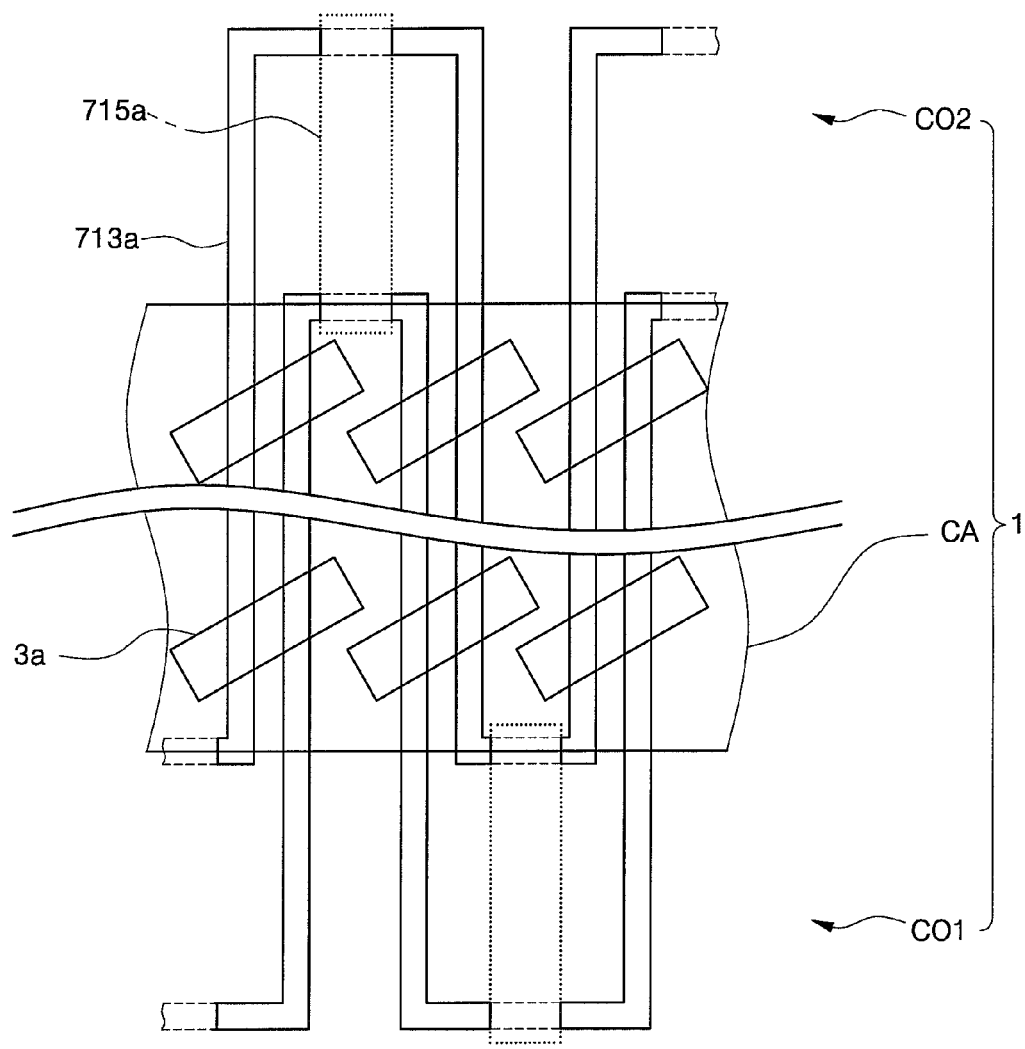

Next, a sacrificial spacer may be formed to cover a sidewall of the sacrificial opening 711a (S110). Subsequently, as illustrated in FIG. 19B, a node separation process may be carried out so that sacrificial spacer patterns 713a can be formed to partially cover the sidewall of the sacrificial opening 711a (S120). The sacrificial spacer may be etched using a node separation mask having a node separation opening 715a. The node separation opening 715a exposes the sacrificial spacer covering the sidewall of the sacrificial opening 711a having the first and second cell sacrificial openings, which extend from the cell array region CA to the first and second core regions CO1 and CO2 and are combined into one opening. The node separation opening 715a also exposes the sacrificial spacer located at end portions of the first and second core regions CO1 and CO2. As a result, the sacrificial spacer patterns 713a may be arranged in the same manner as the conductive lines 722 shown in FIG. 8. Subsequent processes are performed in the same manner and order as described in the previously discussed embodiment with respect to FIG. 11. As a result, the semiconductor device according to an exemplary embodiment shown in FIG. 8 can be fabricated.

A method of fabricating the semiconductor device according to yet another exemplary embodiment will be described with reference to FIGS. 9, 11, 20A, and 20B. The method according to the presently discussed exemplary embodiment differs from the method according to a previously discussed embodiment with respect to FIGS. 11, 12A-12G, and 13A-13E. Specifically, the difference lies in terms of the shape of a sacrificial opening made in a hard mask in step S100 of FIG. 11, the shape of a node separation opening made in a node separation mask used during a node separation process in step S120, and the arrangement of a contact pad mask in step S160.

Figure 20A:
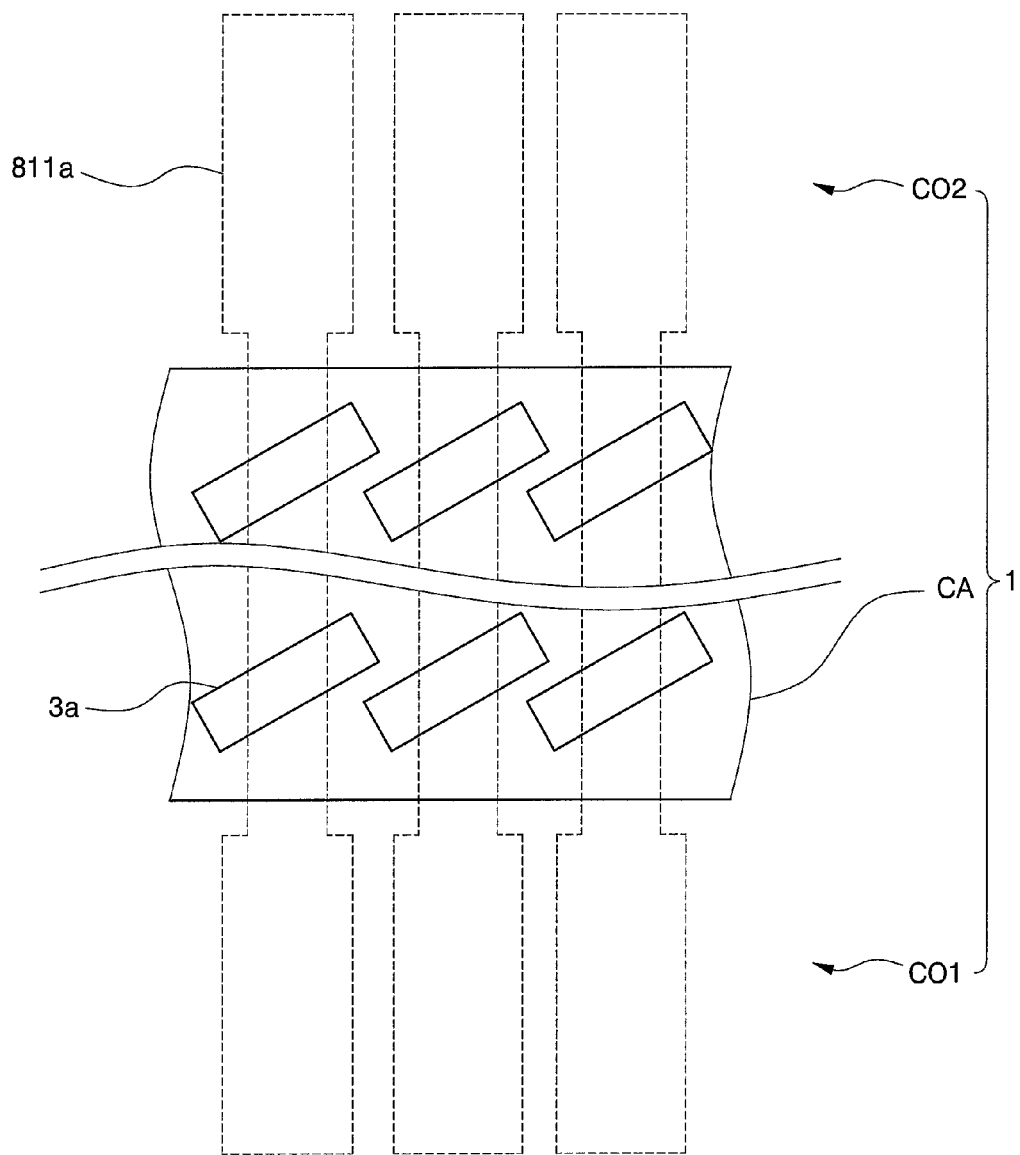
FIGS. 20A and 20B are cross-sectional views illustrating a method of fabricating a semiconductor device according to yet another alternative exemplary disclosed embodiment.

More specifically, in order to fabricate the semiconductor device according to the presently discussed embodiment, a hard mask having sacrificial openings 811a that extend to first and second core regions CO1 and CO2 across a cell array region CA can be formed as illustrated in FIG. 20A (S100). In this case, each of the sacrificial openings 811a may have a greater width in the first and second core regions CO1 and CO2 than in the cell array region CA.

Subsequently, sacrificial spacers may be formed to cover sidewalls of the sacrificial openings 811a (S110). A node separation mask having node separation openings 815a that expose the sacrificial spacers covering the sidewalls of both end portions of the sacrificial openings 811a can be formed. Next, the sacrificial spacers may be etched using the node separation mask as an etch mask so that sacrificial spacer patterns 813a can be formed (S120). Thereafter, a conductive layer may be formed on a substrate having trenches using fabrication processes according to a previously discussed embodiment with respect to FIG. 11 (S150).

In addition, contact pad masks may be formed on the conductive layer such that the contact pad masks overlap one of both end portions of each of the trenches (S160). In this case, each of the contact pad masks may include a contact pad region and a connection region. The contact pad region may define a region where contact pads 825p and 825q of the semiconductor device according to a previously disclosed exemplary embodiment with respect to FIG. 9 will be formed. In this process, conductive lines 822 may be formed by the method of fabricating the semiconductor device according to the exemplary embodiment discussed with respect to FIG. 11 (S170).

A method of fabricating a semiconductor device according to yet another exemplary embodiment will now be described with reference to FIGS. 10, 11, and 21. The method according to the presently discussed exemplary embodiment differs from the method according to the previously discussed exemplary embodiment with respect to FIGS. 20A and 20B. Specifically, the presently discussed method differs in terms of the arrangement of a node separation opening made in a node separation mask used during a node separation process in step S120 of FIG. 11.

Figure 20B:
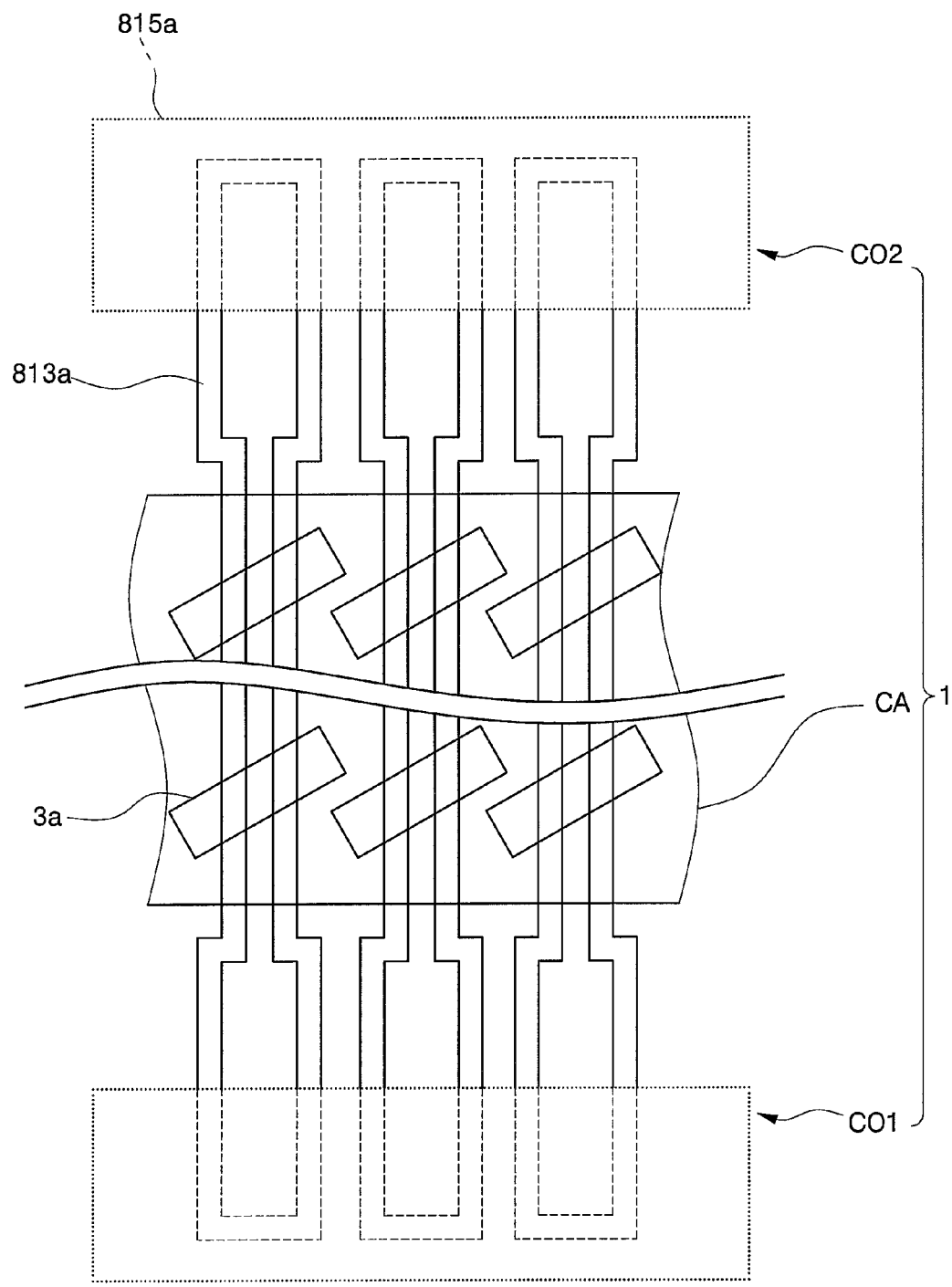

More specifically, a sacrificial spacer may be formed in the same manner as in the method according to the previously disclosed exemplary embodiment with respect to FIGS. 20A and 20B described above (S110). Subsequently, a node separation process may be performed to form sacrificial spacer patterns 913a as illustrated in FIG. 21. The sacrificial spacer patterns 913a may define regions where conductive lines will be formed later. Thus, the conductive lines may be determined by arrangement of the sacrificial spacer patterns 913a.

Figure 21:
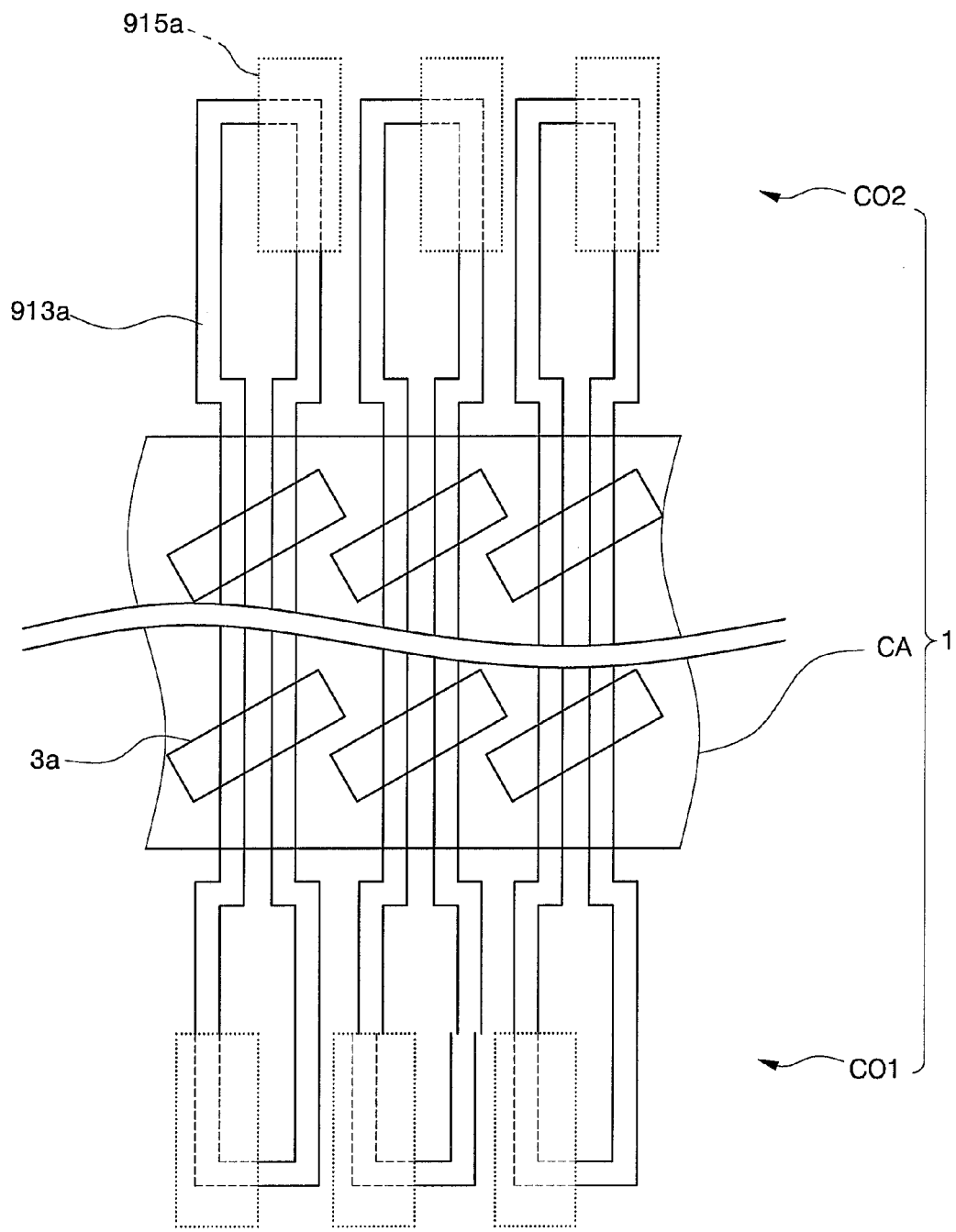
FIG. 21 is a cross-sectional view illustrating a method of fabricating a semiconductor device according to yet another alternative exemplary disclosed embodiment.

As a result, a node separation process of etching a predetermined portion of the sacrificial spacer may be performed using a node separation mask having a node separation opening 915a as shown in FIG. 21, so that the sacrificial spacer patterns 913a can be formed. For convenience of description, because the arrangement of the sacrificial spacer patterns 913a is the same as that of conductive lines 922 described in a previously discussed exemplary embodiment with respect to FIG. 10, a detailed description thereof will be omitted here. Therefore, the semiconductor device according to the exemplary embodiment disclosed in FIG. 10 can be fabricated by the method of fabricating the semiconductor device according to presently disclosed embodiment.

As explained thus far, in order to increase integration efficiency, the embodiments of the present disclosure provide methods of disposing conductive lines having a line width smaller than the resolution limit in a lithography process. Furthermore, according to the methods of the present disclosure, a sufficient space can be obtained between contact pads. The sufficient space between the contact pads may lead to an improvement in the process margin of a semiconductor device, so that a contact failure due to misalignment in a lithography process can be prevented. As a consequence, the integration density of a semiconductor device may be improved.

Exemplary embodiments of the present disclosure have been disclosed herein and, although specific terms are employed, they are to be used and interpreted in a generic and descriptive sense only and not for purpose of limitation. Accordingly, it will be understood by those of ordinary skill in the art that various changes in form and details may be made without departing from the spirit and scope of the present disclosure as set forth in the following claims.

What is claimed is:

1. A semiconductor device comprising:
    a semiconductor substrate including a first core region and a second core region, between which a cell array region is interposed;
    first, second, third, and fourth conductive lines extending to the first and second core regions across the cell array region;
    first contact pads electrically connected to end portions of the second and fourth conductive lines in the first core region; and
    second contact pads electrically connected to end portions of the first and third conductive lines in the second core region,
    wherein the first contact pads are arranged diagonally adjacent to each other, and the second contact pads are arranged diagonally adjacent to each other.

2. The semiconductor device according to claim 1, wherein each of the first and third conductive lines extends by a first length from the cell array region to the first core region and extends from the cell array region to the second core region by a second length, the second length being greater than the first length, and
    each of the second and fourth conductive lines extends by the first length from the cell array region to the second core region and extends by the second length from the cell array region to the first core region.

* * * * *